US012628308B2

(12) United States Patent
Lee et al.

(10) Patent No.:  US 12,628,308 B2
(45) Date of Patent:       May 12, 2026

(54) ELECTRONIC DEVICE AND METHOD FOR CONTROLLING TEMPERATURE THEREOF

(71) Applicant: SAMSUNG ELECTRONICS CO., LTD., Suwon-si (KR)

(72) Inventors: Hongji Lee, Suwon-si (KR); Hyoujoo Kwon, Suwon-si (KR); Hyuncheol Park, Suwon-si (KR); Sunok Jung, Suwon-si (KR); Seongmin Je, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 780 days.

(21) Appl. No.: 17/974,210

(22) Filed: Oct. 26, 2022

(65) Prior Publication Data

US 2023/0232567 A1      Jul. 20, 2023

Related U.S. Application Data

(63) Continuation of application No. PCT/KR2022/015620, filed on Oct. 14, 2022.

(30) Foreign Application Priority Data

Jan. 18, 2022   (KR) ........................ 10-2022-0007234
Feb. 24, 2022   (KR) ........................ 10-2022-0024567

(51) Int. Cl.
 H05K 7/20            (2006.01)
 G05B 19/4155        (2006.01)
(52) U.S. Cl.
 CPC ...........  H05K 7/20 (2013.01); G05B 19/4155 (2013.01); G05B 2219/50333 (2013.01)
(58) Field of Classification Search
 CPC .................. H05K 7/20; G05B 19/4155; G05B 2219/50333
 See application file for complete search history.

(56) References Cited

U.S. PATENT DOCUMENTS 6,029,119 A      2/2000  Atkinson
8,115,139 B2     2/2012  Scharf et al.
(Continued)

FOREIGN PATENT DOCUMENTS

CN       111207839       5/2020
CN       112577611       3/2021
(Continued)

OTHER PUBLICATIONS

Extended European Search Report dated Feb. 19, 2025 for EP Application No. 22922323.5.
(Continued)

*Primary Examiner* — Robert E Fennema
*Assistant Examiner* — Yvonne Trang Follansbee
(74) *Attorney, Agent, or Firm* — NIXON & VANDERHYE P.C.

(57) ABSTRACT

An electronic device may include a temperature sensor, a display, and a processor operatively connected to the temperature sensor, wherein the processor may be configured to: in response to identifying, by using the temperature sensor that the ambient temperature of the electronic device is changed beyond a preconfigured level within a predetermined time, measure the internal temperature of the electronic device; and in response to identifying, through comparison, that the measured internal temperature of the electronic device is lower than the ambient temperature of the electronic device by more than a predetermined level, control at least one component inside the electronic device to perform control to raise the internal temperature of the electronic device to a preconfigured first level.

19 Claims, 11 Drawing Sheets

(56) References Cited

U.S. PATENT DOCUMENTS

| | | | |
|---|---|---|---|
| 9,880,781 B2 | 1/2018 | Oh et al. | |
| 10,025,329 B2 | 7/2018 | Slaby et al. | |
| 10,282,271 B2 | 5/2019 | Shin et al. | |
| 11,366,486 B2 * | 6/2022 | Jung | G06F 9/48 |
| 11,426,079 B1 * | 8/2022 | Sunden | G16H 50/30 |
| 11,520,387 B2 | 12/2022 | Koo et al. | |
| 11,747,874 B2 | 9/2023 | Choi | |
| 2008/0187022 A1 * | 8/2008 | Bellifemine | G01J 5/07 |
| | | | 374/E13.003 |
| 2014/0372356 A1 * | 12/2014 | Bilal | G06N 5/02 |
| | | | 706/46 |
| 2015/0057830 A1 * | 2/2015 | Slaby | G06F 1/324 |
| | | | 700/300 |
| 2017/0177034 A1 * | 6/2017 | North | G06F 1/1677 |
| 2018/0082631 A1 * | 3/2018 | Chang | G09G 3/3648 |
| 2019/0057586 A1 * | 2/2019 | Kangralkar | H04W 4/029 |
| 2019/0073945 A1 * | 3/2019 | Chaji | G09G 3/20 |
| 2021/0165442 A1 | 6/2021 | Jung et al. | |
| 2021/0181820 A1 | 6/2021 | Shenoy et al. | |
| 2022/0026284 A1 * | 1/2022 | Clements | G01K 3/14 |

FOREIGN PATENT DOCUMENTS

| | | |
|---|---|---|
| JP | 2007323678 A2 | 12/2007 |
| KR | 10-2001-0037304 A | 5/2001 |
| KR | 10-1440362 B1 | 9/2014 |
| KR | 10-2016-0044032 A | 4/2016 |
| KR | 10-2017-0068252 | 6/2017 |
| KR | 10-2018-0130872 A | 12/2018 |
| KR | 10-2020-0017260 A | 2/2020 |
| KR | 10-2021-0030849 A | 3/2021 |
| KR | 10-2021-0037548 A | 4/2021 |
| KR | 10-2316441 B1 | 10/2021 |
| KR | 10-2021-0135940 A | 11/2021 |
| WO | WO 2023/140464 A1 | 7/2023 |

OTHER PUBLICATIONS

PCT International Search Report dated Jan. 26, 2023 for PCT/KR2022/015620.
Notification of Publication dated Jul. 27, 2023 for PCT/KR2022/015620.

* cited by examiner

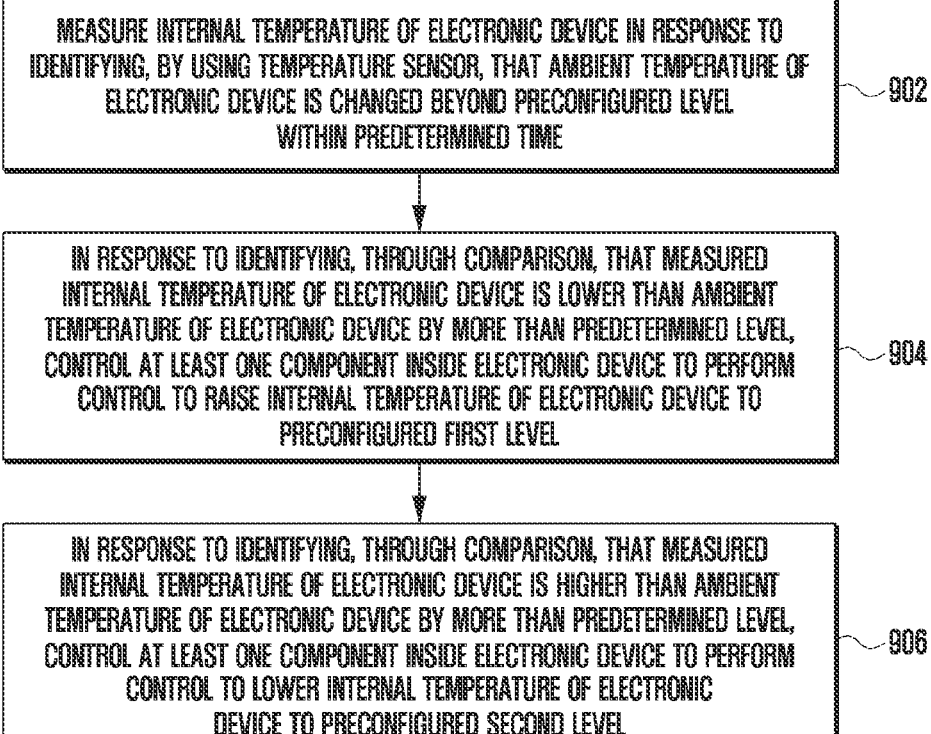

MEASURE INTERNAL TEMPERATURE OF ELECTRONIC DEVICE IN RESPONSE TO IDENTIFYING, BY USING TEMPERATURE SENSOR, THAT AMBIENT TEMPERATURE OF ELECTRONIC DEVICE IS CHANGED BEYOND PRECONFIGURED LEVEL WITHIN PREDETERMINED TIME — 902

IN RESPONSE TO IDENTIFYING, THROUGH COMPARISON, THAT MEASURED INTERNAL TEMPERATURE OF ELECTRONIC DEVICE IS LOWER THAN AMBIENT TEMPERATURE OF ELECTRONIC DEVICE BY MORE THAN PREDETERMINED LEVEL, CONTROL AT LEAST ONE COMPONENT INSIDE ELECTRONIC DEVICE TO PERFORM CONTROL TO RAISE INTERNAL TEMPERATURE OF ELECTRONIC DEVICE TO PRECONFIGURED FIRST LEVEL — 904

IN RESPONSE TO IDENTIFYING, THROUGH COMPARISON, THAT MEASURED INTERNAL TEMPERATURE OF ELECTRONIC DEVICE IS HIGHER THAN AMBIENT TEMPERATURE OF ELECTRONIC DEVICE BY MORE THAN PREDETERMINED LEVEL, CONTROL AT LEAST ONE COMPONENT INSIDE ELECTRONIC DEVICE TO PERFORM CONTROL TO LOWER INTERNAL TEMPERATURE OF ELECTRONIC DEVICE TO PRECONFIGURED SECOND LEVEL — 906

ELECTRONIC DEVICE AND METHOD FOR CONTROLLING TEMPERATURE THEREOF

CROSS-REFERENCE TO RELATED APPLICATIONS

This application claims priority to International Patent Application PCT/KR2022/015620, filed Oct. 14, 2022, which designates the United States and claims priority to KR Patent Application No. 10-2022-0007234, filed Jan. 18, 2022, and to KR Patent Application No. 10-2022-0024567, filed Feb. 24, 2022, the disclosures of which are all hereby incorporated by reference herein in their entireties.

BACKGROUND

Field

An electronic device may provide, for example, for measuring and providing a user's biometric information and/or a method for reducing a standby time for measuring the user's biometric information.

Description of Related Art

In line with development of digital technologies, there has been widespread use of various types of electronic devices such as a personal digital assistant (PDA), a smartphone, a tablet personal computer, an artificial intelligent (AI) speaker, a wearable device, a digital camera, and/or an Internet of things (IoT) device. The hardware part and/or software part of such electronic devices have been continuously developed to support and enhance the functionality of the electronic devices.

For example, an electronic device may include a sensor configured to sense (or measure) various pieces of information (or data), and may provide various pieces of relevant information (or function) based on sensing data acquired from the sensor. For example, the electronic device may measure a biometric signal by using the sensor, and may provide various pieces of information (for example, health information) related to the user's health based on the measured biometric signal. Recently, an electronic device may include a sensor (for example, temperature sensor) capable of measuring the user's body temperature, so as to measure the temperature of at least a part of the user's body with the sensor and to provide the same to the user through the electronic device. For example, the electronic device may measure the user's skin temperature and provide temperature information to the user.

SUMMARY

A wearable device (e.g., a smart watch) is worn by a user in daily life regardless of whether the user is indoors or outdoors, and the influence of external environment temperature cannot be ignored when measuring the user's body temperature with the smart watch. For example, when the user has entered indoors after staying outdoors at a cold place in winter, the internal temperature of the smart watch has dropped due to the outdoor temperature, or when the user has entered indoors after staying outdoors at a hot place in summer, the internal temperature of the smart watch has risen due to the outdoor temperature, making it necessary to maintain the smart watch at room temperature for a period of time and to use the same when the internal temperature of the smart watch matches with the indoor temperature to some extent, in order to measure a substantially accurate body temperature.

The user may find it inconvenient to measure body temperature with the smart watch because it is not until the smart watch is kept at room temperature for at least a period of time or is worn by the user for at least a period of time that a substantially accurate body temperature can be measured.

In addition, it may be difficult to measure a substantially accurate body temperature in a situation in which there is a large difference between the internal temperature of the smart watch and the indoor temperature because the user has measured his/her body temperature without waiting for at least a period of time.

Problems to be solved are not limited to the above-mentioned problems, and may be variously expanded without deviating from the idea and scope.

An electronic device according to various example embodiments may include: a temperature sensor; a display; and a processor operatively connected to the temperature sensor, wherein the processor may be configured to: in response to a determination, at least by using the temperature sensor, that the ambient temperature of the electronic device is changed beyond a preconfigured level within a predetermined time, measure the internal temperature of the electronic device; and in response to a determination, at least through comparison, that the measured internal temperature of the electronic device is lower than the ambient temperature of the electronic device by more than a predetermined level, control at least one electronic component inside the electronic device to raise the internal temperature of the electronic device to at least a preconfigured first level.

An electronic device according to various example embodiments may include: a temperature sensor; a display; and a processor operatively connected, directly or indirectly, to the temperature sensor, wherein the processor may be configured to: in response to identifying, at least by using the temperature sensor, that the ambient temperature of the electronic device is changed beyond a preconfigured level within a predetermined time, measure the internal temperature of the electronic device; and in response to identifying, at least through comparison, that the measured internal temperature of the electronic device is higher than the ambient temperature of the electronic device by more than a predetermined level, control at least one electronic component inside the electronic device to lower the internal temperature of the electronic device to at least as low as a preconfigured second level.

A method for controlling a temperature of an electronic device according to various example embodiments may include: in response to identifying, by using at least a temperature sensor, that the ambient temperature of the electronic device is changed beyond a preconfigured level within a predetermined time, measuring the internal temperature of the electronic device; in response to identifying, at least through comparison, that the measured internal temperature of the electronic device is lower than the ambient temperature of the electronic device by more than a predetermined level, controlling at least one component inside the electronic device to raise the internal temperature of the electronic device to at least a preconfigured first level; and in response to identifying, at least through comparison, that the measured internal temperature of the electronic device is higher than the ambient temperature of the electronic device by more than a predetermined level, controlling at least one component inside the electronic device to lower the internal temperature of the electronic device to at least as low as a preconfigured second level.

An electronic device according to various example embodiments may shorten a body temperature measurement standby time. As used herein, the body temperature measurement standby time may refer to a time necessary to adjust the internal temperature of the electronic device, which has been affected by external environments, so as to match with the indoor temperature (or room temperature) within a predetermined level.

An electronic device according to various example embodiments may adjust the internal temperature of the electronic device by using an application inside the electronic device, without a separate hardware element, thereby shortening the body temperature measurement standby time necessary to measure a substantially accurate body temperature.

An electronic device according to various example embodiments may measure the user's body temperature substantially accurately in a situation involving an abrupt change in the temperature outside the device, may provide temperature information to the user such that the user's body temperature returns to normal ranges in response to the user's body temperature condition, and may adjust the indoor environment based on the user's choice or may provide a guide such that the indoor environment is adjusted.

BRIEF DESCRIPTION OF DRAWINGS

These and other features, aspects, and advantages will become better understood when the following detailed description is read with reference to the accompanying drawings in which like characters represent like parts throughout the drawings, wherein:

FIG. 4 is a block diagram showing a configuration of an electronic device according to various example embodiments;

FIG. 9 illustrates a guide providing operation of an electronic device according to various example embodiments.

DETAILED DESCRIPTION

Figure 1:
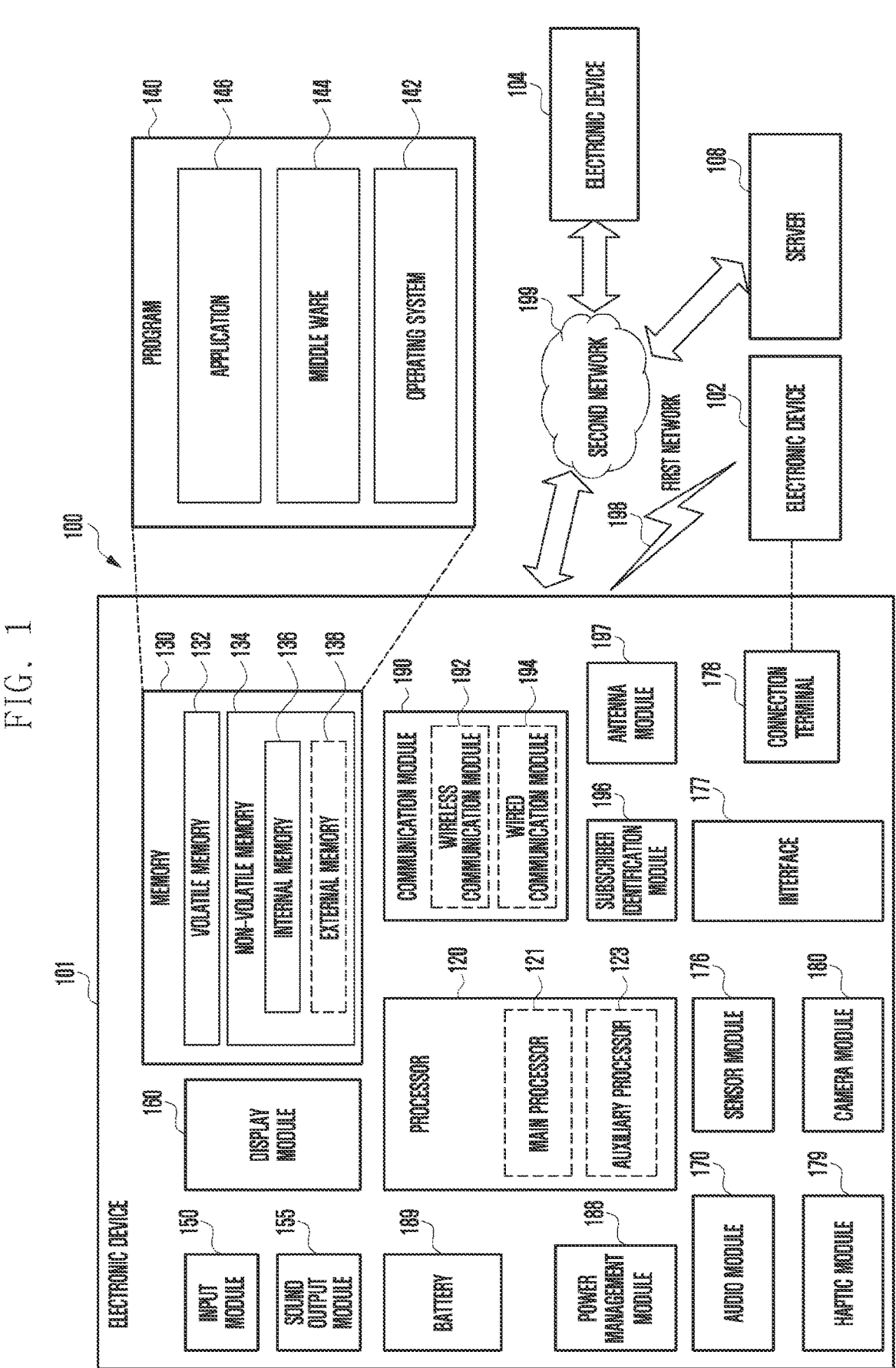
FIG. 1 is a block diagram of an electronic device in a network environment according to various example embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element.

As used in connection with various example embodiments, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various example embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
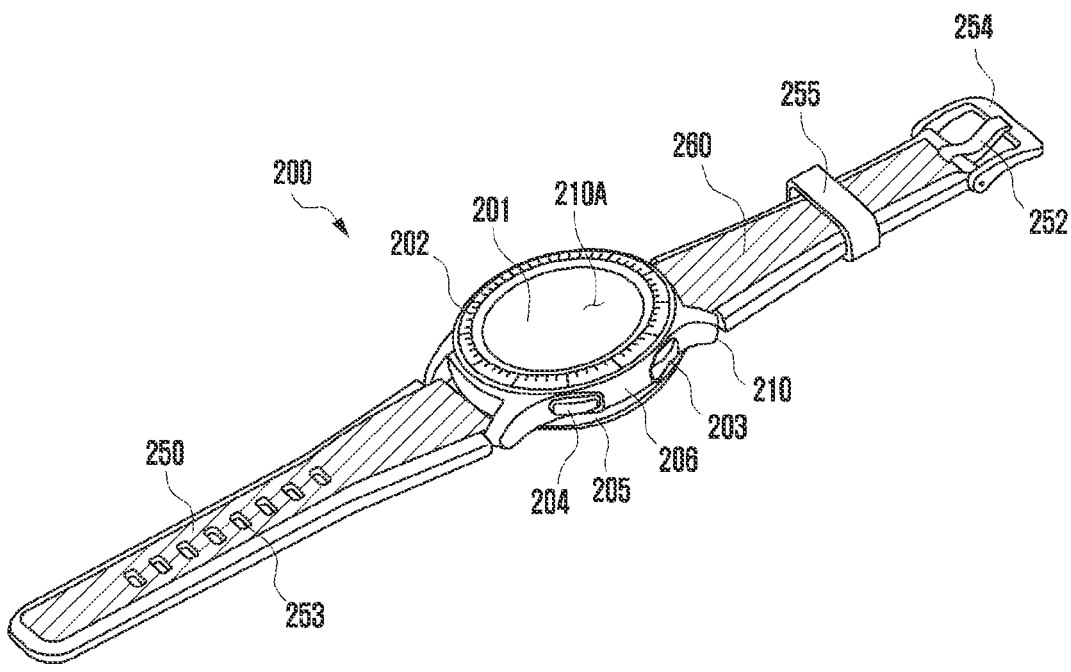
FIGS. 2A and 2B are perspective views of an electronic device according to an embodiment.
Figure 2B:
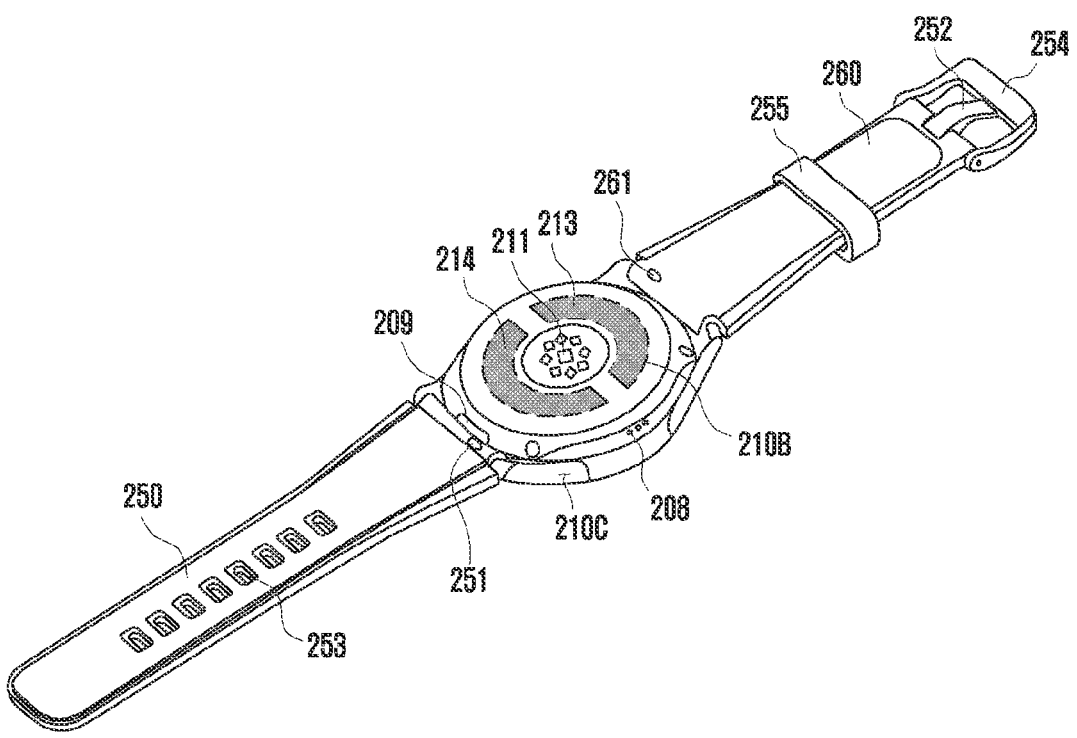

Referring to FIGS. 2A and 2B, the electronic device 200 (e.g., the electronic device 101 in FIG. 1) according to an embodiment may include a housing 210 including a first surface (or a front surface) 210A, a second surface (or a rear surface) 210B, and a side surface 210C surrounding a space between the first surface 210A and the second surface 210B, and a binding members 250 and 260 connected to at least a portion of the housing 210 and configured to attachable or detachable the electronic device 200 to or from a body part (e.g., the wrist, the ankle, or the like). In another embodiment (not shown), a structure configuring a part of the first surface 210A, the second surface 210B, and the side surface 210C in FIG. 2A may be referred to as a housing. According to an embodiment, the first surface 210A may be formed by the front plate 201 (e.g., a polymer plate or a glass plate including various coating layers) having at least a portion which is substantially transparent. The second surface 210B may be formed by the substantially opaque rear plate. The rear plate may be formed of, for example, coated or colored glass, ceramic, a polymer, a metal (e.g., aluminum, stainless steel (STS), or magnesium), or a combination of at least two thereof. The side surface 210C may be coupled to the front plate 201 and the rear plate and formed by a side bezel structure (or a "side surface member") 206 including a metal and/or a polymer. In some embodiments, the rear plate and side bezel structure may be integrally formed and include the same material (e.g., a metal material such as aluminum). The binding members 250 and 260 may include various materials and shapes. A woven fabric, leather, rubber, urethane, metal, ceramic, or a combination of at least two thereof may be used to form an integrated unit link and a plurality of unit links which are movable with respect to each other.

According to an embodiment, the electronic device 200 may include at least one of a display 220 (see FIG. 3), audio modules 205 and 208 (e.g., the audio module 170 in FIG. 1), a sensor module 211 (e.g., the sensor module 176 in FIG. 1), key input devices 202, 203, and 204 (e.g., the input module 150 in FIG. 1), and a connector hole 209. In some embodiments, the electronic device 200 may have at least one of the components (e.g., the key input devices 202, 203, and 204, the connector hole 208 and/or the sensor module 211) omitted therefrom or may include another component added thereto.

The display 220 may be exposed through, for example, at least a portion of the front plate 201. The shape of the display 220 may be a shape corresponding to the shape of the front plate 201, and may have various shapes such as a circle, an oval, or a polygon. The display 220 may be coupled or disposed adjacent to a touch sensing circuit (e.g., the sensor module 176 in FIG. 1), a pressure sensor (e.g., the sensor module 176 in FIG. 1) capable of measuring the intensity (pressure) of a touch, and/or a fingerprint sensor (e.g., the sensor module 176 in FIG. 1).

The audio modules 205 and 208 may include a microphone hole 205 and a speaker hole 208. A microphone configured to acquire an external sound may be disposed inside the microphone hole 205, and in some embodiments, a plurality of microphones may be disposed in the microphone hole 205 to sense the direction of sound. The speaker hole 208 may be used as an external speaker and a call receiver. In some embodiments, the speaker hole 208 and the microphone hole 205 may be implemented by a single hole, or a speaker may be provided without the speaker hole 208 (e.g., a piezo speaker).

The sensor module 211, comprising at least one sensor, may generate an electrical signal or a data value corresponding to an internal operating state or an external environmental state of the electronic device 200. The sensor module 211 may include, for example, a biometric sensor module 211 (e.g., a heart rate monitor (HRM) sensor) disposed on the second surface 210B of the housing 210. The electronic device 200 may include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The sensor module 211 may include electrode regions 213 and 214 forming a part of the surface of the electronic device 200, and a biosignal detection circuit (not shown) electrically connected, directly or indirectly, to the electrode regions 213 and 214. For example, the electrode regions 213 and 214 may include a first electrode region 213 and a second electrode region 214 disposed on the second surface 210B of the housing 210. The sensor module 211 may be configured such that the electrode regions 213 and 214 obtain an electric signal from a part of the user's body and the biosignal detection circuit detects the user's biometric information based on the electric signal.

The key input devices 202, 203, and 204 may include a wheel key 202 disposed on the first surface 210A of the housing 210 and rotatable in at least one direction, and/or side key buttons 203 and 204 disposed on the side surface 210C of the housing 210. The wheel key may have a shape corresponding to the shape of the front plate 201. In another embodiment, the electronic device 200 may not include one or all of the above-mentioned key input devices 202, 203, and 204 and the key input device 202, 203, or 204 which is included in the electronic device 200 may be implemented on the display 220 in another form such as a soft key.

The connector hole 209 may accommodate a connector (e.g., a USB connector) for transmitting/receiving power and/or data to and from an external electronic device, and may include another connector hole (not shown) which can accommodate a connector for transmitting/receiving an audio signal to and from an external electronic device. The electronic device 200 may further include, for example, a connector cover (not shown) configured to cover at least a portion of the connector hole 209 and block the inflow of foreign substances into the connector hole.

The binding members 250 and 260 may be detachably attached to at least a partial region of the housing 210 by using locking members 251 and 261. The binding members 250 and 260 may include one or more of a fixing member 252, a fixing member fastening hole 253, a band guide member 254, and a band fixing ring 255.

The fixing member 252 may be configured to fix the housing 210 and the binding members 250 and 260 to a part (e.g., the wrist, the ankle, or the like) of the user's body. The fixing member fastening hole 253 may fix the housing 210 and the binding members 250 and 260 to a part of the user's body along with the fixing member 252. The band guide member 254 may be configured to limit the range of movement of the fixing member 252 when the fixing member 252 is fastened with the fixing member fastening hole 253 such that the binding members 250 and 260 can be attached to and in close contact with a part of the user's body. The band fixing ring 255 may limit the range of movement of the binding members 250 and 260 when the fixing member 252 and the fixing member fastening hole 253 are fastened to each other.

Figure 2C:
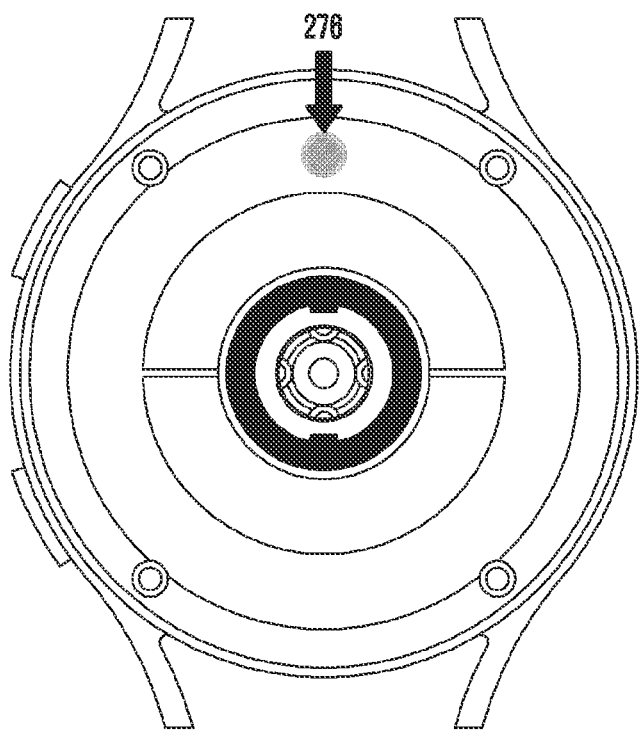
FIG. 2C illustrates a location of a temperature sensor in an electronic device according to various example embodiments.

FIG. 2C illustrates a location of a temperature sensor in the electronic device 200 according to various embodiments.

According to an embodiment, the temperature sensor 276 may be mounted on the electronic device 200 to detect a user's body temperature by various designated methods. For example, the temperature sensor 276 may include various types of temperature sensors, such as an infrared (IR) thermopile sensor, an integrated circuit (IC) temperature sensor, a thermistor, or a resistance temperature detector (RTD). According to an embodiment, the IR temperature sensor, which is a non-contact type temperature sensor, may detect the amount of infrared radiation emitted from the user's body and perform filtering and conversion to estimate a body temperature. According to an embodiment, the IC temperature sensor, which uses the temperature dependence of the silicon band gap, may refer to a temperature sensor formed by converting a transistor temperature sensor that produce an output current proportional to an absolute temperature into an IC. According to an embodiment, the thermistor may be made by sintering a metal oxide (e.g., chromium, cobalt, manganese, nickel, and/or titanium), and may refer to a resistor that has a great change in resistance by a temperature. For example, the thermistor may be classified into a positive temperature coefficient (PTC) thermistor in which the resistance increases when the temperature increases, and a negative temperature coefficient (NTC) thermistor in which the resistance decreases when the temperature increases. According to an embodiment, the RTD may refer to a temperature sensor made of a pure material such as a metal (e.g., platinum, nickel, or copper), and may measure a body temperature by converting resistance into temperature.

Figure 3:
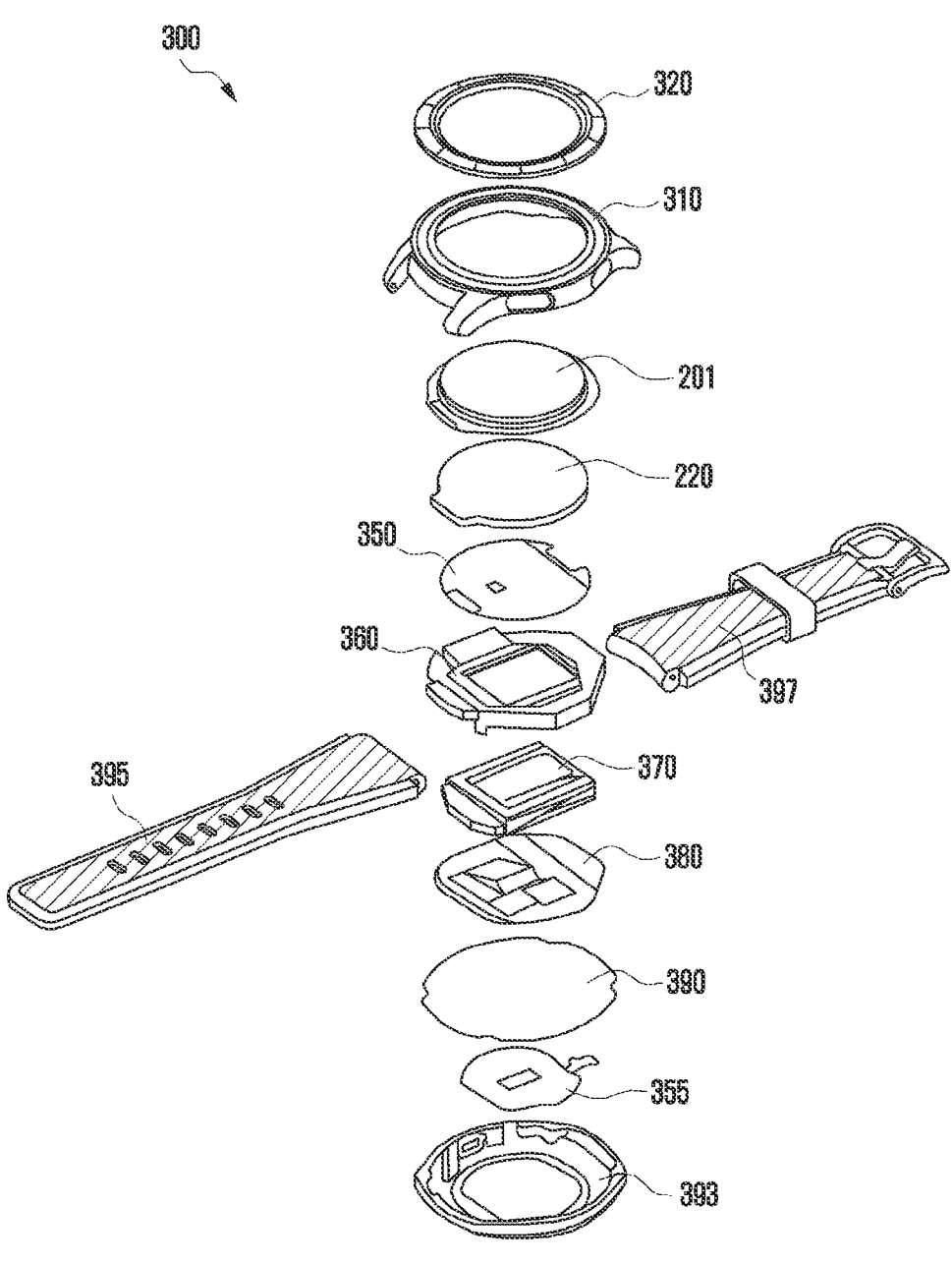
FIG. 3 is an exploded perspective view of an electronic device according to an example embodiment.

Referring to FIG. 3, an electronic device 300 (e.g., the electronic device 101 in FIG. 1 or the electronic device 200 in FIGS. 2A-2B) may include a side bezel structure 310, a wheel key 320, a front plate 201, a display 220, a first antenna 350, a second antenna 355, a support member 360 (e.g., a bracket), a battery 370, a printed circuit board 380, a sealing member 390, a rear plate 393, and binding members 395 and 397. At least one of the components of the electronic device 300 may be identical or similar to at least one of the components of the electronic device 101/200 in FIG. 1 or FIG. 2, and overlapping descriptions will be omitted. The support member 360 may be disposed inside the electronic device 300 and connected to the side bezel structure 310, or may be integrally formed with the side bezel structure 310. The support member 360 may be formed of, for example, a metal material and/or a non-metal (e.g., a polymer) material. The support member 360 may have one surface coupled to the display 220 and the other surface coupled to the printed circuit board 380. A processor (e.g., the processor 120 in FIG. 1), a memory (e.g., the memory 130 in FIG. 1), and/or an interface (not shown) may be mounted on the printed circuit board 380. The processor may include, for example, one or more of a central processing unit, an application processor, a graphic processing unit (GPU), an application processor, a sensor processor, or a communication processor.

The memory 130, as shown in FIG. 1 for example, may include, for example, a volatile memory or a non-volatile memory. The interface (not shown) may include, for example, a high-definition multimedia interface (HDMI), a universal serial bus (USB) interface, an SD card interface, and/or an audio interface. The interface (not shown) may electrically or physically connect the electronic device 300 to an external electronic device, and may include a USB connector, an SD card/MMC connector, or an audio connector.

The battery 370, which is a device for supplying power to at least one component of the electronic device 300, may include, for example, a non-rechargeable primary cell, a rechargeable secondary cell, or a fuel cell. At least a portion of the battery 370 may be disposed substantially on the same plane as the printed circuit board 380. The battery 370 may be integrally disposed inside the electronic device 100/200/300/400, or may be disposed to be attachable to or detachable from the electronic device 100/200/300/400.

The first antenna 350 may be disposed between the display 220 and the support member 360. The first antenna 350 may include, for example, a near field communication (NFC) antenna, a wireless charging antenna, and/or a magnetic secure transmission (MST) antenna. The first antenna 350 may, for example, perform short-range communication with an external device or wirelessly transmit/receive power required for charging to/from an external device, and may transmit a magnetic-based signal including a short-range communication signal or payment data. In another embodiment, the antenna structure may be formed by a part of the side bezel structure 310 and/or the support member 360 or a combination thereof.

The second antenna 355 may be disposed between the printed circuit board 380 and the rear plate 393. The second antenna 355 may include, for example, a near field communication (NFC) antenna, a wireless charging antenna, and/or a magnetic secure transmission (MST) antenna. The second antenna 355 may, for example, perform short-range communication with an external device or wirelessly transmit/receive power required for charging to/from an external device, and may transmit a magnetic-based signal including a short-range communication signal or payment data. In another embodiment, an antenna structure may be formed by a part of the side bezel structure 310 and/or the rear plate 393 or a combination thereof.

The sealing member 390 may be positioned between the side bezel structure 310 and the rear plate 393. The sealing member 390 may be configured to block moisture and foreign substances from flowing from the outside into a space surrounded by the side bezel structure 310 and the rear plate 393.

Figure 4:
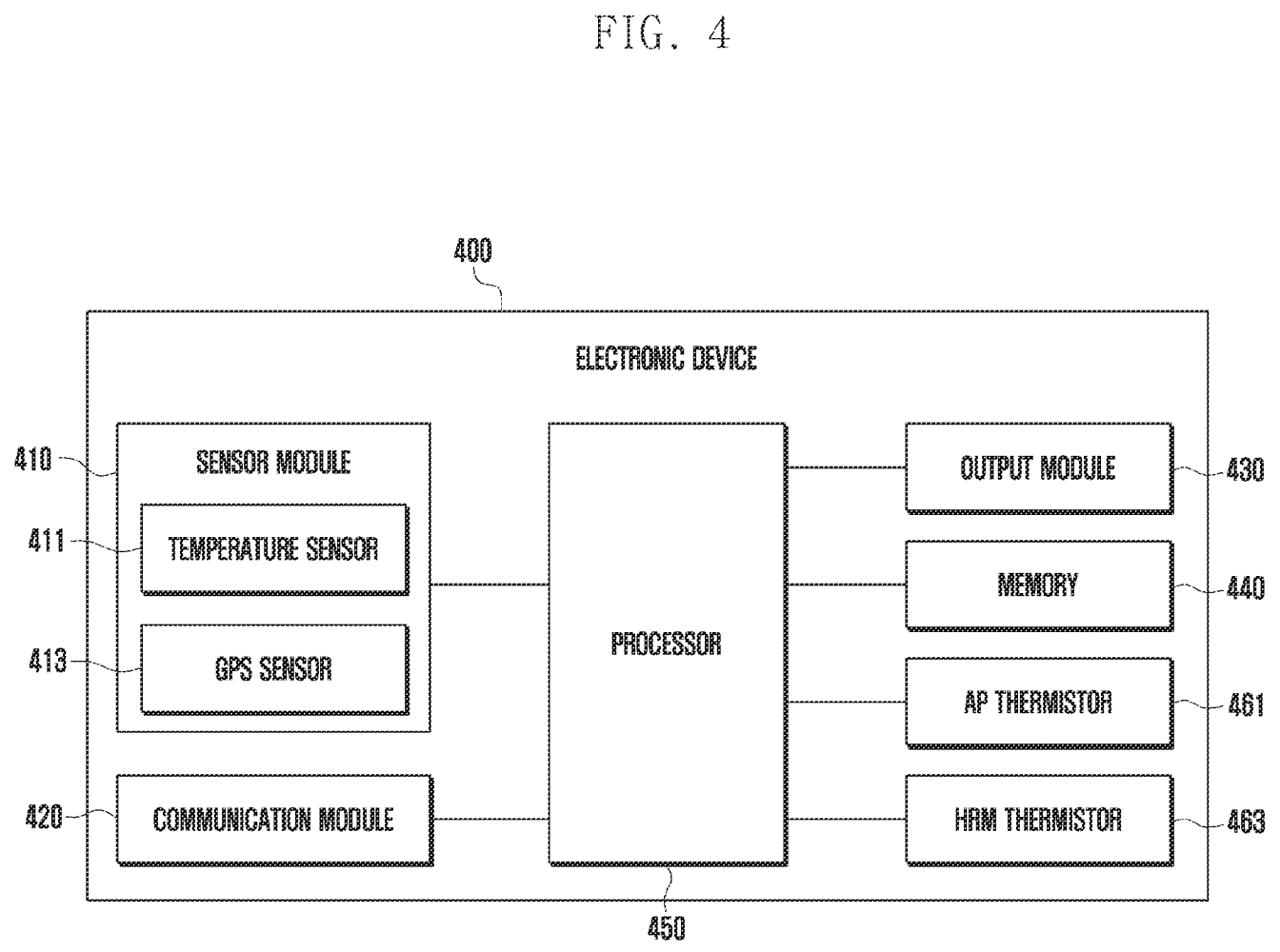

FIG. 4 is a block diagram showing a configuration of an electronic device according to various embodiments.

An electronic device 400 according to an embodiment may refer to an electronic device of a subject to be measured for a body temperature thereof. According to an embodiment, the electronic device 400, which is a device that can be worn on a part of the subject's body, may include, for example, a wearable device, such as a watch-type device, a ring-type device, or an in-ear type device.

Referring to FIG. 4, the electronic device 400 (e.g., a wearable device) according to an embodiment may include a sensor module 410, a communication module 420, an output module 430, a memory 440, and/or a processor 450.

According to an embodiment, the sensor module 410 may include a configuration corresponding to the sensor module 176 as described in the description with reference to FIG. 1. According to the disclosure, the sensor module 410 may include a temperature sensor (body thermometer) 411. According to some embodiments, although not shown, the sensor module 410 may include various other sensors such as an acceleration sensor, a barometric pressure sensor, a gyro sensor, and/or a biometric sensor (e.g., a PPG sensor).

According to an embodiment of the disclosure, the electronic device 400 may sense a user's body temperature, based on sensing data by using the temperature sensor 411 of the sensor module 410.

According to an embodiment, the temperature sensor 411 may be mounted on the electronic device 100/200/300/400 to detect a user's body temperature by various designated methods. For example, the temperature sensor 411 may include various types of temperature sensors such as an infrared (IR) thermopile sensor, an integrated circuit (IC) temperature sensor, a thermistor, or a resistance temperature detector (RTD). According to an embodiment, the IR temperature sensor, which is a non-contact type temperature sensor, may detect the amount of infrared radiation emitted from the user's body and perform filtering and conversion to estimate a body temperature. According to an embodiment, the IC temperature sensor, which uses the temperature dependence of the silicon band gap, may refer to a temperature sensor formed by converting a transistor temperature sensor that produce an output current proportional to an absolute temperature (K. kelvin) into an IC.

According to an embodiment, the thermistor may be made by sintering a metal oxide (e.g., chromium, cobalt, manganese, nickel, and/or titanium), and may refer to a variable resistor that has a great change in resistance value by a temperature. For example, the thermistor may be classified into a positive temperature coefficient (PTC) thermistor in which the resistance increases when the temperature increases, and a negative temperature coefficient (NTC) thermistor in which the resistance decreases when the temperature increases. According to an embodiment, the RTD may refer to a temperature sensor made of a pure material such as a metal (e.g., platinum, nickel, or copper), and may measure a body temperature by converting resistance into temperature.

According to an embodiment, the communication module 420, comprising communication circuitry, may include a configuration corresponding to the wireless communication module 192 as described in the description with reference to FIG. 1. According to an embodiment, the communication module 420 may support communication with an external device through a first network (e.g., a short-range communication network such as Bluetooth, BLE, WiFi direct, IrDA, and/or ultra-wide band (UWB)) or a second network (e.g., a telecommunication network such as legacy network (e.g., 3G network and/or 4G network), 5G network, next-generation communication (e.g., new radio (NR)) network, Internet, or computer network (e.g., LAN or WAN)). According to an embodiment, the electronic device 400 may perform communication with an external device (e.g., the server 108 and/or another electronic device 101, 102, or 104 in FIG. 1) through a network using the communication module 420. According to an embodiment, the communication module 420 may transmit data generated by the electronic device 400 to an external device and may receive data transmitted from the external device. Each "module" herein may comprise circuitry.

According to an embodiment, the output module 430 may include a configuration corresponding to the sound output module 155, the haptic module 179, and/or the display module 160 as described in the description with reference to FIG. 1. According to an embodiment, the output module 430 may output information corresponding to various data (e.g., an acoustic signal, a mechanical stimulus, and/or an image signal) generated in the electronic device 400 to the outside of the electronic device 400 through the output module, based on the type (e.g., watch type, ring type, or in-ear type)

of the electronic device 400. In an embodiment of the disclosure, the output module 430 may visually, auditory and/or tactilely provide various information related to the user's body temperature under the control of the processor 450. Each "processor" herein comprises processing circuitry.

According to an embodiment, the memory 440 may include a configuration corresponding to the memory 130 as described in the description with reference to FIG. 1. According to an embodiment, the memory 440 may store various data used by the electronic device 400. The data may include, for example, input data or output data for an application (e.g., the program 140 in FIG. 1) and a command related thereto.

According to an embodiment, the memory 440 may include an application related to a first function (or operation) for performing measurement and monitoring (or management) of a user's body temperature, and a second function (or operation) for performing connection and data transmission/reception with an external device, which may be performed by the processor 450. For example, body temperature measurement may be performed by a health management (e.g., body temperature measurement) application, and communication with an external device may be performed by a communication application. According to an embodiment, the application may be stored as software (e.g., the program 140 in FIG. 1) in the memory 440, and may be executable by the processor 450.

According to an embodiment, the memory 440 may store various data related to operating a function of the electronic device 100/200/300/400. The data may include at least one of AP temperature information measured using the AP thermistor 461, temperature information of the rear surface (back glass) (e.g., the rear plate 393 in FIG. 3) of the electronic device 100/200/300/400 measured using the HRM thermistor 463, or the internal temperature of the electronic device measured using the temperature sensor 411.

In an embodiment, reference information may include at least one reference value (or an initially configured value) (e.g., a first level, a second level) for determining whether a user's body temperature is abnormal. In an embodiment, correction information may include a correction value for estimating a core body temperature. In addition, the correction information may include a body temperature correction value for each body part predefined according to the type of the electronic device 100/200/300/400. In an embodiment, the sensing data may include data obtained from the temperature sensor 411.

According to an embodiment, the processor 450 may determine a standard (e.g., a first level, a second level) for determining a user's body temperature, and may control a function (or operation) to measure a user's body temperature, based on the determined standard. According to an embodiment, when a user's body temperature is measured, the processor 450 may estimate a corrected core body temperature, based on a designated correction value, with respect to the measured skin temperature, and may perform or control a function (or operation) to calculate the actual body temperature of the user. According to an embodiment, estimating a core body temperature may include, for example, correcting and/or supplementing the primarily measured skin temperature by using various surrounding information or additional information.

According to an embodiment, the processor 450 may measure a user's skin temperature through the sensor module 410 (e.g., the temperature sensor 411), determine the user's body temperature, based on the measured skin temperature, and control an operation (or processing) related to providing the user's body temperature information, based on the determined body temperature. According to an embodiment, the processor 450 may detect a designated event related to providing body temperature information, and control an operation (or processing) related to providing the body temperature information to an external device by using the communication module 420.

According to an embodiment, the processor 450 may detect a designated event related to measuring and/or providing body temperature information, based on detection of an abnormal body temperature of a user or detection of a request by an external device.

According to an embodiment, the processor 450 may provide the measured body temperature information to an external device by using the designated communication module 420, based on the detection of the designated event.

According to an embodiment, the operations performed by the processor 450 may be stored in the memory 440 and executed by instructions that cause the processor 450 to operate when executed.

According to various embodiments, the processor 450 may control various operations related to a general function of the electronic device 100/200/300/400 in addition to the above functions. For example, the processor 450 may communicate with an external device to transmit/receive data, and may control the output of the transmitted/received data by using a designated method through a designated output module. As another example, the processor 450 may receive input signals corresponding to various touch event or proximity event inputs supported by a touch-based or proximity-based input interface, and control function operation accordingly.

According to various embodiments, the electronic device is not limited to the components illustrated in FIG. 4, and at least one component may be omitted or added. According to an embodiment, the electronic device 400 may include a voice recognition module (not shown). For example, the voice recognition module (not shown) may refer to an embedded ASR (eASR) module and/or an embedded NLU (eNLU).

Various embodiments described in the disclosure may be implemented in a recording medium readable by a computer or a similar device using software, hardware, or a combination thereof. In various embodiments, the recording medium may include a computer-readable recording medium recording a program for executing operations of: in response to identifying, by using the temperature sensor 411, that the ambient temperature of the electronic device 100/200/300/400 is changed beyond a preconfigured level within a predetermined time, measuring the internal temperature of the electronic device 100/200/300/400; in response to identifying, through comparison, that the measured internal temperature of the electronic device 100/200/300/400 is lower than the ambient temperature of the electronic device 100/200/300/400 by more than a predetermined level, controlling at least one component inside the electronic device to perform control to raise the internal temperature of the electronic device to a preconfigured first level; and in response to identifying, through comparison, that the measured internal temperature of the electronic device is higher than the ambient temperature of the electronic device by more than a predetermined level, controlling at least one component inside the electronic device to perform control to lower the internal temperature of the electronic device to a preconfigured second level.

According to an embodiment, the temperature sensor 411 may refer to a sensor for measuring a body temperature. The temperature sensor 411 may measure the temperature of an object such as an object comprising skin. At this time, since the measured temperature of an object is affected by the internal temperature of the electronic device 100/200/300/400, the measured skin temperature may be corrected in consideration of the internal temperature value of the electronic device. At this time, in case that the temperature inside the electronic device is low, the measured skin temperature may be low.

Each embodiment herein may be used in combination with any other embodiment(s) described herein.

According to an embodiment, the electronic device 400 may include at least one of a processor (e.g., an application processor (AP) or a communication processor (CP)) 450 and a battery (e.g., the battery 189 of FIG. 1) therein. The electronic device 400 may include a thermistor in the vicinity of at least one of an application processor (AP) in the processor 450, a battery 189, and a communication processor (CP) in the processor 450. The thermistor may refer to a variable resistor that has a great change in a resistance value by a temperature. For example, the electronic device 400 may measure the temperature of the internal processor 450 by using an AP thermistor 461 near an application processor (AP) in the processor 450. Alternatively, the electronic device 400 may estimate the temperature of a photoplethysmography (PPG) sensor that measures biometric information by using the HRM thermistor 463 mounted on the rear surface (back glass) thereof. The electronic device 400 may measure the skin temperature of a user wearing the electronic device 400 by using the HRM thermistor 463. The electronic device 400 may prevent damage to internal parts or burns on the user's wrist by using at least one thermistor (e.g., the AP thermistor 461 or the HRM thermistor 463).

According to an embodiment, the processor 450 may exchange at least one of a command or data with another electronic device (e.g., another electronic device 101, 102, or 104 in FIG. 1) by using the communication module 420. The processor 450 may measure the current location of a user or the current location of the electronic device 100/200/300/400, based on the wireless signal received using the communication module 420. Alternatively, the processor 450 may measure the current location of the user or the current location of the electronic device 400 by using at least one of a GPS sensor 413, a WiFi positioning system (WPS) (not shown), or an inertial sensor (not shown). For example, the processor 450 may determine the current location of the user by using the GPS sensor 413 and the inertial sensor (not shown) together. Alternatively, the processor 450 may configure a preconfigured place (e.g., the user's home) as a geo-fence, and determine that a user is currently located outdoors in response to identifying that the user crosses a boundary configured as the geo-fence. Conversely, the processor 450 may determine that the user is currently located indoors in response to identifying that the user does not cross the boundary configured as a geo-fence. The geo-fence is a term combining geography and a fence, and may refer to a technology for defining a virtual boundary or zone, based on an actual location.

According to an embodiment, the processor 450 may include at least one processor, and may be physically divided into a main processor performing high-performance processing and an auxiliary processor performing low-power processing, to be driven. Alternatively, one processor may perform processing by switching between high performance and low power depending on the situation.

According to an embodiment, the processor 450 may determine that a user's location has been changed from a first area (e.g., the outdoor space) to a second area (e.g., the indoor space), in response to identifying that a GPS signal is weakened or identifying that a preconfigured signal is detected. The processor 450 may compare the temperature of the first area with the temperature of the second area by using the temperature sensor 411 in response to identifying that the user's location has been changed to the second area, and control at least one component inside the electronic device 400 in response to identifying that the temperature of the second area where the user is located is relatively higher than the temperature of the first area, thereby increasing the internal temperature of the electronic device 400 relatively quickly to the preconfigured first level. For example, the processor 450 may execute at least one application to perform control such that the internal temperature of the electronic device 400 is increased to the preconfigured first level. Here, the first level may refer to the internal temperature of the electronic device 400, and may refer to a temperature level in which the electronic device 400 can measure the user's body temperature within a fixed error. In case that the electronic device 400 is in a power saving mode, the processor 450 may switch from the power saving mode (e.g., a state in which the operation using the maximum clock frequency of the AP is restricted) to a normal mode (e.g., frequency clock becomes higher than in a power saving mode, or multiple cores are all available in a multi-core) to increase the internal temperature of the electronic device 400 to the preconfigured first level. Alternatively, the processor 450 may perform control using a display (e.g., the display module 160 in FIG. 1) such that the internal temperature of the electronic device 400 relatively quickly is increased to the preconfigured first level.

According to an embodiment, the processor 450 may perform control such that at least one application having been executed at a predetermined frequency or more in the second area is executed, in response to identifying that the temperature of the second area where the user is located is relatively higher than that of the first area. The at least one application executed at a predetermined frequency or more in the second area may vary according to a user of the electronic device 400. The processor 450 may execute a specific application in a specific place (e.g., the indoor space, the second area) in response to a user's selection. The processor 450 may store the execution frequency of the application and may perform control such that the application having been executed at an execution frequency exceeding a predetermined level is executed, in case that a user is located in the specific place (e.g., the indoor space or the second area).

According to an embodiment, the processor 450 may control at least one component inside the electronic device 100/200/300/400 in response to identifying that the temperature of the second area where a user is located is relatively lower than the temperature of the first area, thereby relatively quickly lowering the internal temperature of the electronic device to the preconfigured second level in comparison with the normal mode. The normal mode may refer to a state in which a frequency clock becomes higher than in in the power saving mode or a state in which multiple cores are all available in a multi-core. The power saving mode may refer to a state in which an operation using the maximum or a high clock frequency of the AP is restricted.

For example, the processor 450 may stop the operation of at least one application to perform control such that the internal temperature of the electronic device 100/200/300/400 is relatively quickly lowered to the preconfigured second level in comparison with the normal mode. Here, the normal mode may refer to a state in which a frequency clock becomes higher than in the power saving mode or a state in which multiple cores are all available in a multi-core. The power saving mode may refer to a state in which an operation using the maximum or a high clock frequency of the AP is restricted. The processor 450 may switch from the normal mode (e.g., a frequency clock becomes higher than in the power saving mode, or multiple cores are all available in a multi-core) to the power saving mode (e.g., a state in which the operation using the maximum clock frequency of the AP is restricted) to lower the internal temperature of the electronic device 100/200/300/400 to the preconfigured second level. Alternatively, the processor 450 may control the display 160 by changing (e.g., a method of lowering a driving frequency of the display 160 or a method of reducing a current applied to the display 160 to lower the brightness output by the display 160) a mode of the display (e.g., the display module 160 in FIG. 1), to perform control such that the internal temperature of the electronic device 400 is lowered to the preconfigured second level.

According to an embodiment, in case that a user is located in a specific place (e.g., the indoor space, the second area), the processor 450 may execute an application having been executed at an execution frequency exceeding a predetermined level to artificially increase the internal temperature of the electronic device 100/200/300/400. Even in case that the application is not executed, the internal temperature of the electronic device 100/200/300/400 may be increased according to the temperature of the region where the electronic device is located. However, the increase rate may be slower than when the application is executed. The processor 450 may execute at least one application to increase the internal temperature of the electronic device 100/200/300/400 relatively quickly, and may control the internal temperature of the electronic device 400 to measure the user's body temperature. The electronic device according to various example embodiments may increase the internal temperature of the electronic device 100/200/300/400 relatively quickly by executing at least one application, and may reduce the waiting time required for body temperature measurement, thereby providing convenience to a user.

According to an embodiment, the processor 450 may compare the temperature of the second area with the temperature of the first area (e.g., the outdoor space) by using the temperature sensor 411 in response to identifying that the user's location has been changed to the second area (e.g., the indoor space), and may execute at least one application inside the electronic device 400 in response to identifying that the temperature of the second area in which the user is located is relatively higher than the temperature of the first area, thereby performing control such that the internal temperature of the electronic device 400 is increased to the preconfigured first level.

For example, in case that the measured indoor temperature is higher than the outdoor temperature, the processor 450 may determine that the user entered the indoor space after being outdoors in a cold environment such as winter. In this case, since the internal temperature of the electronic device 100/200/300/400 may be relatively low due to exposure to the outdoor space, the measured user's body temperature may be low in case that the temperature is measured in the above state. To compensate for this problem, the processor 450 may output, on a display (e.g., the display module 160 in FIG. 1), information instructing to measure the body temperature after at least a certain period of time (e.g., 10 minutes) has elapsed indoors in order to accurately measure the body temperature in case that the location of the electronic device is changed from the indoor space to the outdoor space. However, in this case, the waiting time required for body temperature measurement is relatively long, which may cause inconvenience to a user.

The electronic device 100/200/300/400 according to various example embodiments may execute at least one application to increase the internal temperature of the electronic device relatively quickly and reduce the waiting time required for body temperature measurement.

According to an embodiment, the processor 450 may execute a frequently used application or function in case that the user enters the indoor space. Alternatively, the processor 450 may recognize a user's usual application usage pattern to execute an application or function that consumes a lot of power. In this case, the electronic device 100/200/300/400 may reduce wasted power by driving necessary functions while reducing the waiting time for body temperature measurement by increasing power consumption.

According to an embodiment, the processor 450 may perform control such that at least one application (e.g., a health application) configured to monitor user's biometric information is executed, in response to identifying that the temperature of the second area where the user is located is relatively higher than that of the first area. According to an embodiment, the processor 450 may collect the user's biometric information by using at least one application configured to monitor user's biometric information and provide the biometric information to the user. The user's biometric information that may be provided by the processor 450 may include, for example, at least one of heart rate, stress, oxygen saturation, and blood pressure. The processor 450 may provide the user with additional information about the change in the body due to the change in the external environment temperature.

According to an embodiment, in the indoor space, the processor 450 may be connected to Wi-Fi to automatically check versions of applications and perform updates if necessary.

According to an embodiment, the electronic device 100/200/300/400 may further include an application that performs an operation of increasing the internal temperature. The processor 450 may execute an application that performs an operation of increasing the internal temperature, in response to identifying that the temperature of the second area where the user is located is relatively higher than that of the first area.

The electronic device 100/200/300/400 according to various example embodiments may change the operation of a component included in the electronic device, thereby increasing the internal temperature of the electronic device relatively quickly and reducing the waiting time required for body temperature measurement.

The electronic device 100/200/300/400 may change the operation of the processor 450 to increase the internal temperature of the electronic device relatively quickly. For example, the electronic device may enable the processor 450 to output relatively high heat by increasing the maximum or a high driving frequency of the processor 450. As another example, in case that the processor 450 includes a plurality of cores, the electronic device may perform control such that the processor 450 outputs relatively high heat, by activating all of the plurality of cores.

The electronic device 100/200/300/400 may change the operation of the display (e.g., the display module 160 in FIG. 1) to increase the internal temperature of the electronic device 400 relatively quickly. For example, the electronic device may control the display 160 to output relatively high heat by increasing the refresh rate of the display 160.

Figure 5:
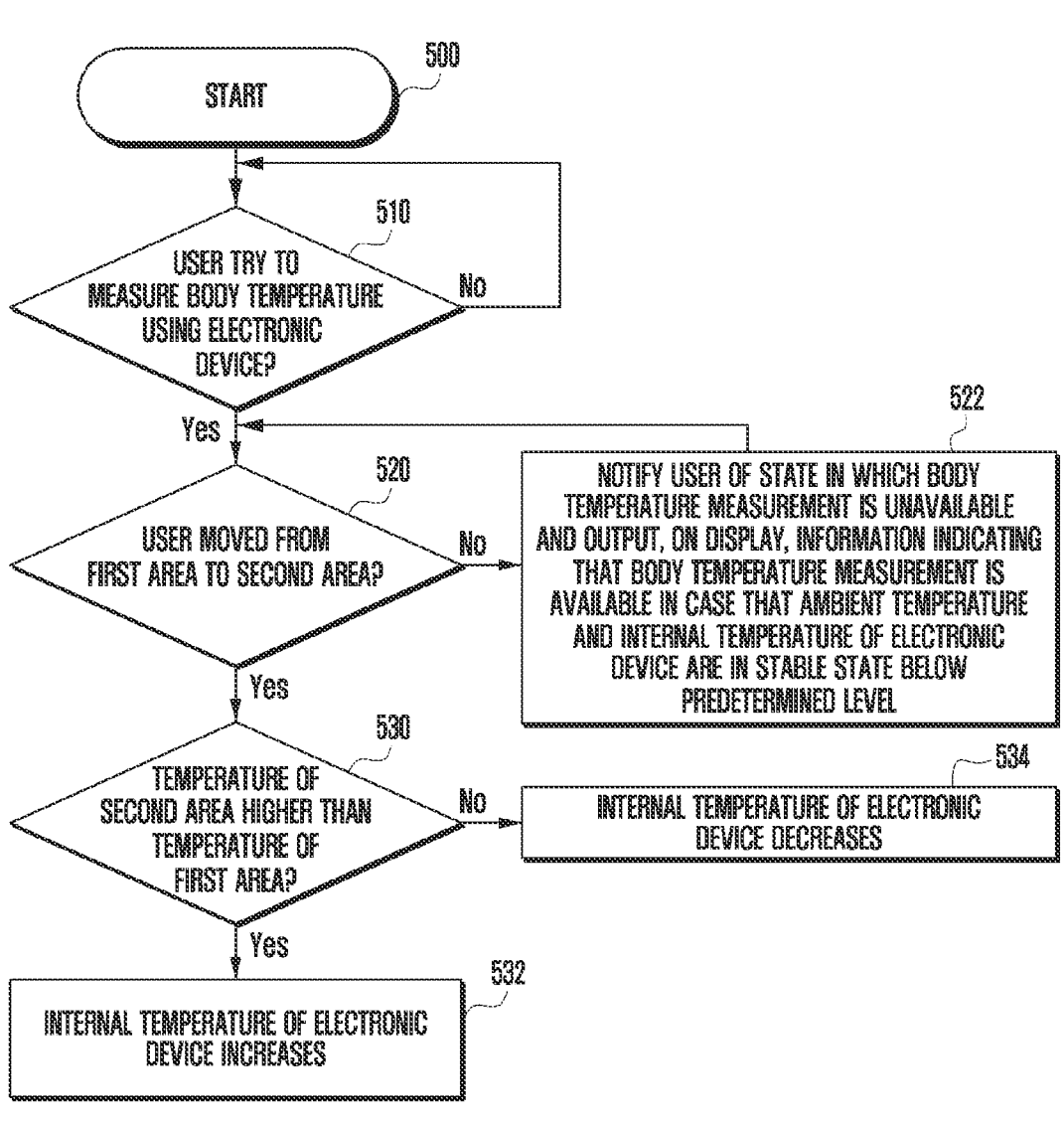
FIG. 5 is a flowchart showing a method for controlling a temperature of an electronic device according to various example embodiments.

FIG. 5 is a flowchart showing a method for controlling a temperature of an electronic device according to various embodiments.

The operations described through FIG. 5 may be implemented based on instructions that may be stored in a computer recording medium or memory (e.g., the memory 440 in FIG. 4). The described method 500 may be executed by the electronic device (e.g., the electronic device 400 in FIG. 4) described above with reference to FIGS. 1 to 4, and the technical features described above will be omitted.

In operation 510, the electronic device 100/200/300/400 may recognize a body temperature measurement event, based on the user's motion. According to an embodiment, the processor (e.g., the processor 450 in FIG. 4) may measure the user's skin temperature by using at least a sensor module (e.g., the sensor module 410 in FIG. 4, including at least one sensor) and/or a temperature sensor (e.g., the temperature sensor 411), determine the user's body temperature, based on the measured skin temperature, and control an operation (or processing) related to providing the user's body temperature information, based on the determined body temperature. According to an embodiment, the processor 450 may detect a designated event related to providing body temperature information and control an operation (or processing) related to providing body temperature information to an external device by using a communication module (e.g., the communication module 420 in FIG. 4).

According to an embodiment, the processor 450 may detect a designated event related to measuring and/or providing body temperature information, based on detection of an abnormal body temperature of a user or detection of a request by an external device. According to an embodiment, the processor 450 may provide the measured body temperature information to the external device by using a designated communication module 420, based on the detection of the designated event.

In operation 520, the processor 450 for example may determine whether the environment is suitable for measuring the user's skin temperature, in response to identifying the user's body temperature measurement request.

For example, the processor 450 may determine whether the user has moved from the first area (e.g., the outdoor space) to the second area (e.g., the indoor space) in operation 520. The outdoor space and the indoor space are mere examples of places, and the places where measurement is performed may not be limited thereto. In case that the temperature changes beyond a predetermined level even in the same indoor space, the processor 450 may classify the space as a separate location. For example, the processor 450 may identify the movement from the first area (e.g., an indoor waiting room) to the second area (e.g., an indoor sauna), based on a change in temperature measured around the electronic device 100/200/300/400. In case that the temperature of the surrounding environment changes beyond a predetermined level even if a user is located indoors, the processor 450 may provide information indicating an unsuitable state for measuring the user's skin temperature, by using a display (e.g., the display module 160 in FIG. 1).

According to an embodiment, the processor 450 may determine that a user is currently located indoors, in response to identifying that the number of GPS satellites detected using the communication module 420 is less than a predetermined level. According to an embodiment, the processor 450 may determine that the user is currently located indoors in response to identifying that the strength of the GPS signal detected using the communication module 420 is less than a predetermined level. According to an embodiment, the processor 450 may determine that the user is currently located indoors, in response to identifying the state in which the number of user's steps are not counted.

According to an embodiment, the processor 450 may identify the user's current location by using the communication module 420, and may receive temperature information near the current location by using at least one of a satellite or a weather service provider (e.g., a weather center), based on the identified user's current location. The processor 450 may compare the received temperature information near the current location and the temperature information around the electronic device 400 measured using the temperature sensor 411, and may provide the user with information indicating that the environment is not suitable for measuring the skin temperature, in response to the difference between the temperature near the current location and the ambient temperature of the electronic device 100/200/300/400 measured using the temperature sensor 411, which exceeds a predetermined level.

According to an embodiment, the processor 450 may measure the current location of the user or the current location of the electronic device 400, based on a wireless signal received using the communication module 420. Alternatively, the processor 450 may measure the current location of the user or the current location of the electronic device 400 by using a GPS sensor 413.

According to an embodiment, the processor 450 may determine that the user's location has been changed from the first area (e.g., the outdoor space) to the second area (e.g., the indoor space), in response to identifying that the GPS signal is weakened or identifying that a preconfigured signal is detected.

In operation 522, the processor 450 may notify the user of a state in which measurement of the body temperature is unavailable, in response to identifying that the user has not been moved from the first area (e.g., the outdoor space) to the second area (e.g., the indoor space) (No at 520), and may output, on a display (e.g., the display module 160 in FIG. 1), information instructing to enter the indoor space for the body temperature measurement.

In operation 530, the processor 450 may identify whether the indoor temperature where the user is currently located is higher than the outdoor temperature, in response to identifying that the user has moved from the first area (e.g., the outdoor space) to the second area (e.g., the indoor space).

According to an embodiment, the processor 450 may identify the outdoor temperature by receiving information from an internal weather application or the weather center. In addition, the processor 450 may identify the temperature of the indoor space in which the electronic device 100/200/300/400 is located, by using the sensor module 410.

In operation 532 (Yes at 530), the processor 450 may increase the internal temperature of the electronic device 100/200/300/400 in response to identifying that the ambient temperature of the electronic device is higher than the temperature near the current location of the electronic device.

According to an embodiment, the processor 450 may perform control such that at least one application having been executed at a predetermined frequency or more in the second area is executed, in response to identifying that the temperature of the second area (e.g., the indoor space) where the user is located is relatively higher than that of the first area (e.g., the outdoor space). The at least one application having been executed at a predetermined frequency or more in the second area may vary according to a user of the electronic device 100/200/300/400. The processor 450 may execute a specific application in a specific place (e.g., the indoor space, the second area) in response to a user's selection. The processor 450 may store the execution frequency of the application, and may perform control such that the application having been executed at an execution frequency exceeding a predetermined level is automatically executed, in case that a user is located in the specific place (e.g., the indoor space, the second area).

According to an embodiment, in case that a user is located in a specific place (e.g., the indoor space, the second area), the processor 450 may execute an application having been executed at an execution frequency exceeding a predetermined level to artificially increase the internal temperature of the electronic device 100/200/300/400. In case that the application is not executed, the internal temperature of the electronic device may increase according to the temperature of the region where the electronic device 400 is located. However, the increase rate may be relatively slower than in case that the application is executed. The processor 450 may executes at least one application to increase the internal temperature of the electronic device relatively quickly in comparison with the case where the application is not executed, and control the internal temperature of the electronic device such that measurement of the user's body temperature is available. The electronic device according to various example embodiments may control at least one component to increase the internal temperature of the electronic device 400 relatively quickly and to reduce the waiting time required for body temperature measurement, thereby providing convenience to the user.

According to an embodiment, the processor 450 may compare the temperature of the second area with the temperature of the first area (e.g., the indoor space) by using the temperature sensor 411, in response to identifying that the user's location has been changed to the second area (e.g., the indoor space), and may execute at least one application inside the electronic device 100/200/300/400 such that the internal temperature of the electronic device is increased to the first preconfigured level, in response to identifying that the temperature of the second area in which the user is located is relatively higher than the temperature of the first area.

In operation(s) 530, the processor 450 may compare temperature of the second area with the temperature of the first area (e.g., the outdoor space) at least by using the temperature sensor 411 in response to identifying that the user's location has been changed to the second area (e.g., the indoor space), and in operation 534 may reduce the internal temperature of the electronic device 100/200/300/400 in response to identifying that the temperature of the second area where the user is located is relatively lower than the temperature of the first area. According to an embodiment, the processor 450 may stop the driving of at least one application inside the electronic device 100/200/300/400 in response to identifying that the temperature of the second area where the user is located is relatively lower than the temperature of the first area, thereby performing control such that the internal temperature of the electronic device is lowered to the preconfigured second level. The processor 450 may switch from the normal mode (e.g., a frequency clock becomes higher than in the power saving mode, or multiple cores are all available in a multi-core) to the power saving mode (e.g., a state in which the operation using the maximum clock frequency of the AP is restricted) to lower the internal temperature of the electronic device to the preconfigured second level. Alternatively, the processor 450 may control the display 160 by changing (e.g., a method of lowering a driving frequency of the display 160 or a method of reducing a current applied to the display 160 to lower the brightness output by the display 160) a mode of the display (e.g., the display module 160 in FIG. 1), to perform control such that the internal temperature of the electronic device 400 is lowered to the preconfigured second level. Here, the second level may refer to the internal temperature of the electronic device, and may refer to a temperature level in which the electronic device can measure the user's body temperature within a fixed error.

Figure 6:
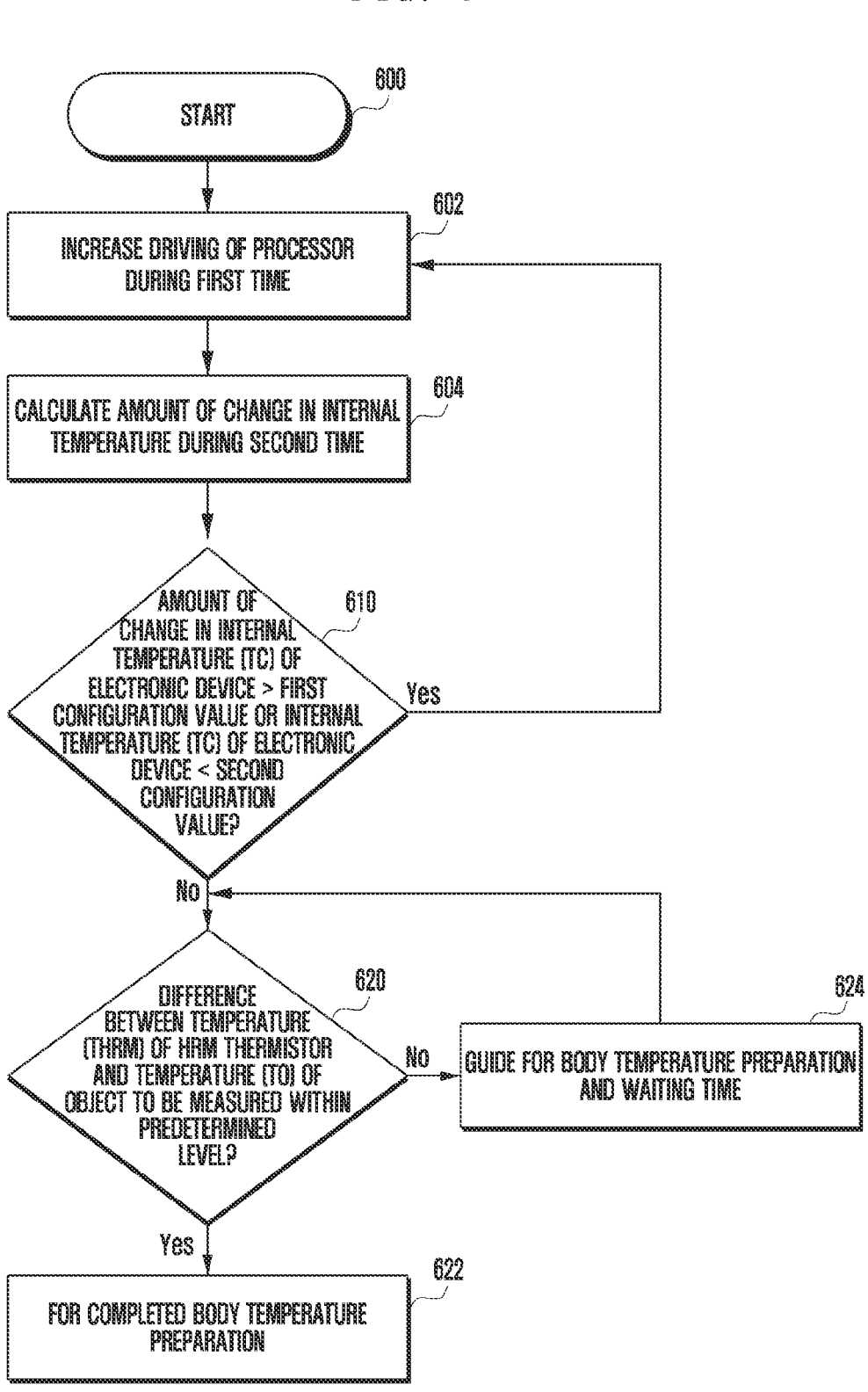
FIG. 6 is a flowchart showing another method for controlling a temperature of an electronic device according to various example embodiments.

FIG. 6 is a flowchart showing another method for controlling a temperature of an electronic device according to various embodiments.

The operations described through FIG. 6 may be implemented based on instructions that may be stored in a computer recording medium or memory (e.g., the memory 440 in FIG. 4). The described method 600 may be executed by the electronic device (e.g., the electronic device 400 in FIG. 4, or any of the electronic devices 100, 200, or 300) described above with reference to FIGS. 1 to 4, and the technical features described above will be omitted.

In operation 602, the processor (e.g., the processor 450 in FIG. 4) may increase the driving of the processor 450 during the first time to increase power consumption of the electronic device 400. The processor 450 may consume power while executing at least one application or a necessary function, and may generate heat during the power consumption process.

In operation 604, the processor 450 may measure the internal temperature of the electronic device 400 during the second time in a state in which power consumption is increased, and may measure the amount of change in the internal temperature of the electronic device 400.

In operation 610, the processor 450 may identify whether the amount of change in the internal temperature of the electronic device 400 exceeds a preconfigured first configuration value and/or the internal temperature (Tc) of the electronic device 400 is less than a preconfigured second configuration value. The processor 450 may increase the driving of the processor 450 during the first time in response to identifying that the amount of change in the internal temperature (Tc) of the electronic device 400 exceeds the preconfigured first reference value, thereby increasing power consumption of the electronic device 400 (602). Even if the processor 450 is driven to change the internal temperature of the electronic device 400 in case that the temperature difference between the internal temperature (Tc) of the electronic device 400 and the ambient temperature of the electronic device 400 exceeds a predetermined level, the internal temperature of the electronic device 400 may be quickly restored to the level before the change due to the relatively great difference with respect to the surrounding environment of the electronic device 400.

For example, when the temperature of the second area is relatively high than the first area in case that the electronic device 400 located in the first area has moved to the second area, the internal temperature of the electronic device 400 may be relatively lower than the ambient temperature of the electronic device 400. In this case, the electronic device 400 may increase the internal temperature Tc of the electronic device 400 by increasing the driving of the AP. However, as the temperature difference between the second area and the first area increases, the internal temperature (Tc) of the electronic device 400 that has moved to the second area may be relatively much lower than the ambient temperature of the electronic device 400. In this case, even if the electronic device 400 increases the driving of the AP to increase the internal temperature (Tc) of the electronic device 400, the measured amount of change in the internal temperature (Tc) of the electronic device 400 may be relatively great due to the great difference between the internal temperature (Tc) of the electronic device 400 and the ambient temperature of the electronic device 400. That is, the electronic device 400 may determine that the difference between the ambient temperature and the internal temperature (Tc) of the electronic device 400 is relatively great, based on the measured amount of change in the internal temperature (Tc) which is relatively great. The electronic device 400 may provide a user with information indicating an unstable state for measuring the skin temperature due to the external environmental factors of the electronic device 400, based on determining that the difference between the ambient temperature and the internal temperature (Tc) of the electronic device 400 is relatively great.

Alternatively, the processor 450 may increase the driving of the processor 450 during the first time to increase power consumption of the electronic device 400 (602), in response to identifying that the internal temperature (Tc) of the electronic device 400 is less than the preconfigured second reference value. In case that the internal temperature (Tc) of the electronic device 400 is less than the second reference value, the electronic device 400 may determine that the internal temperature (Tc) is relatively significantly lower than the standard human body temperature (e.g., about 36.5°). In case that the internal temperature (Tc) of the electronic device 400 is lower than the standard human body temperature (e.g., about 36.5°) beyond a predetermined level, the internal temperature (Tc) of the electronic device 400 may affect the measurement of the human skin temperature. The accurate measurement of the user's skin temperature by the electronic device 400 may be difficult due to the internal temperature (Tc) that is lower than the human standard body temperature (e.g., about 36.5°) beyond a predetermined level. The electronic device 400 may provide a user with information indicating an unstable state for measuring the skin temperature due to the external environmental factors of the electronic device 400, based on determination that the internal temperature (Tc) is relatively significantly lower than the standard human body temperature.

The processor 450 may perform operation 620 in response to identifying that the amount of change in the internal temperature of the electronic device 400 is less than the first configuration value. Alternatively, the processor 450 may perform operation 620 in response to identifying that the internal temperature of the electronic device 400 exceeds the second configuration value. In operation 620, the processor 450 may identify whether a difference between the temperature of the HRM thermistor 463 and the skin temperature measured using the temperature sensor 411 is less than a predetermined level. The processor 450 may output, on a display (e.g., the display module in FIG. 1), information indicating that the body temperature measurement preparation is completed, in response to identifying that a difference between the temperature of the HRM thermistor 463 and the skin temperature measured using the temperature sensor 411 is less than a predetermined level from (622).

Alternatively, the processor 450 may output, on a display (e.g., the display module 160 in FIG. 1), information indicating to the user that the body temperature measurement preparation is not completed, in response to identifying that a difference between the temperature of the HRM thermistor 463 and the skin temperature measured using the temperature sensor 411 is beyond a predetermined level (624). In addition, the processor 450 may calculate a waiting time required for body temperature measurement preparation and output the calculated waiting time on the display 160 (624).

Figure 7:
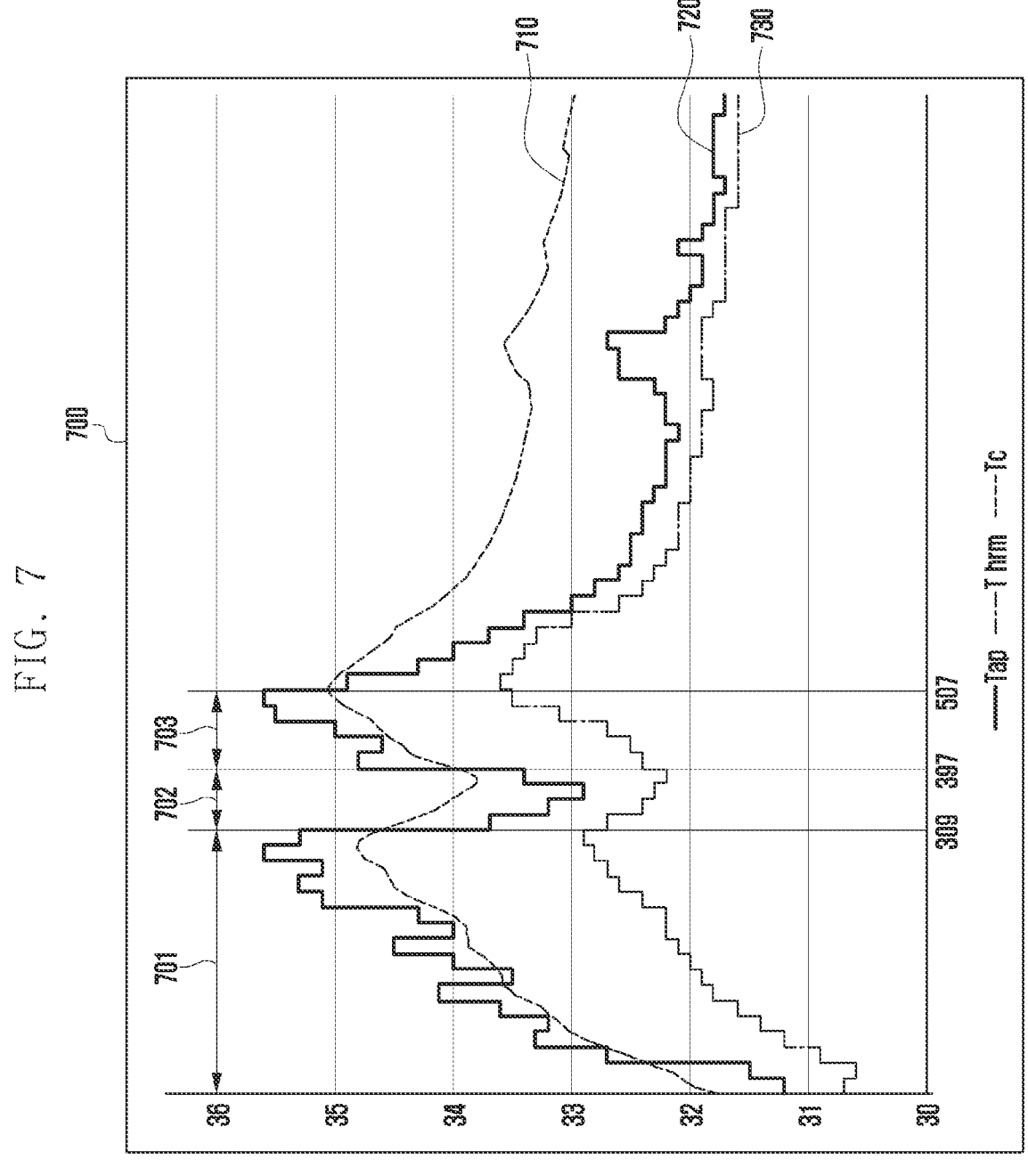
FIG. 7 is a graph illustrating changes in the internal temperature of an electronic device according to various example embodiments.

FIG. 7 is a graph illustrating changes in the internal temperature of an electronic device according to various embodiments.

According to an embodiment, the processor (e.g., the processor 450 in FIG. 4) may increase the driving of the processor 450 during the first time 701 to increase power consumption of the electronic device (e.g., the electronic device 400 in FIG. 4). The processor 450 may consume power while executing at least one application or a necessary function, and may generate heat during the power consumption process.

As noted from graph 700 in FIG. 7, as the temperature 720 of the processor 450 rises during the first time 701, the internal temperature 710 of the electronic device 400 and the temperature 730 of the HRM thermistor (e.g., the HRM thermistor 463 in FIG. 4) also rises.

Thereafter, during the second time 702, the processor 450 may be maintained in a sleep mode. In this case, the processor 450 may reduce power consumption, and the temperature 720 of the processor 450 may decrease as the result of the operation. As noted from graph 700 in FIG. 7, as the temperature 720 of the processor 450 decreases during the second time 702, the internal temperature 710 of the electronic device 400 and the temperature 730 of the HRM thermistor (e.g., the HRM thermistor 463 in FIG. 4) also decreases.

Thereafter, as the temperature 720 of the processor 450 rises during a third time 703, the internal temperature 710 of the electronic device 400 and the temperature 730 of the HRM thermistor (e.g., the HRM thermistor 463 in FIG. 4) also rises.

The electronic device 400 may increase the temperature 720 of the processor 450 during the first time 701 and the third time 703. However, even if the electronic device 400 increases the temperature 720 of the processor 450 during the first time 701, the temperature 720 of the processor 450 may not be raised during the second time 702 immediately after the first time 701. In this case, since the inside of the electronic device 400 is not sufficiently heated, the internal temperature 720 of the electronic device 400 may decrease relatively quickly compared to a case where the inside of the electronic device 400 is sufficiently heated. On the other hand, in case that the electronic device 400 increases the temperature 720 of the processor 450 during the third time 703 immediately after the second time 702, since the inside of the electronic device 400 is heated by increasing the temperature 720 of the processor 450 during the previous first time 701, the internal temperature 720 may decrease relatively slowly, compared to the second time 702, even if the temperature 720 of the processor 450 does not rise again immediately after the third time 703. As the inside of the electronic device 400 becomes warmer, the internal temperature 720 may decrease relatively slowly even if the temperature 720 of the processor 450 is not raised. In this case, the internal temperature (Tc) of the electronic device 400 may have a relatively small temperature difference compared to the ambient temperature of the electronic device 400, and a substantially accurate skin temperature may be measured in case that the internal temperature (Tc) of the electronic device 400 is not greatly different from the periphery thereof.

According to an embodiment, the electronic device 400 may determine that the electronic device 400 is in a state in which stable measurement of the skin temperature is available, in response to identifying that the slope at which the internal temperature 720 decreases is less than a predetermined level in a situation where the temperature 720 of the processor 450 is not raised. The electronic device 400 may provide a user with information indicating that the electronic device 400 is in a state in which stable measurement of the skin temperature is available, by using a display (e.g., the display module 160 in FIG. 1), based on determination that the same is in the state in which the stable measurement of the skin temperature is available.

According to an embodiment, the electronic device 400 may measure the user's location by using a GPS sensor (e.g., the GPS sensor 413 in FIG. 4) and determine whether the user is indoors or outdoors. Based on the GPS sensor 413, the electronic device 400 may store an indoor temperature measurement value before going outdoors and then retrieve the stored indoor temperature data to use the same as a reference temperature in response to identifying that the user has entered the same place.

According to an embodiment, the electronic device 400 may determine the temperature at which the measured temperature of the object is in thermal equilibrium using the temperature 730 of the HRM thermistor (e.g., 463 in FIG. 4) and a temperature sensor (e.g., the temperature sensor 411 in FIG. 4), based on user data.

According to an embodiment, in case that the temperature of the second area (e.g., the indoor space) where the electronic device 400 is currently located is relatively lower than the temperature of the first area (e.g., the outdoor space) where the electronic device 400 was located, the electronic device 400 may determine that the user entered a relatively cool indoor environment after being in a hot environment such as the outdoor space in summer. In this case, the electronic device 400 may be exposed to a relatively high outdoor temperature and thus have an increased internal temperature, and the measured body temperature thereby may relatively high. The processor 450 may perform control such that the electronic device 400 is changed to a sleep mode in which minimum or low power consumption is maintained, in response to identifying that the temperature of the second area (e.g., the indoor space) where the user is located is relatively lower than the temperature of the first area (e.g., the outdoor space).

According to an embodiment, the processor 450 may perform control such that the driving of at least one application having been executed less than a predetermined frequency in the second area is stopped, in response to identifying that the temperature of the second area (e.g., the indoor space) where the user is located is relatively lower than the temperature of the first area (e.g., the outdoor space). In this case, the electronic device 400 may provide a function frequently used by the user or at least one function required by the user while stopping the overall function of the electronic device 400 for the purpose of body temperature measurement.

Figure 8:
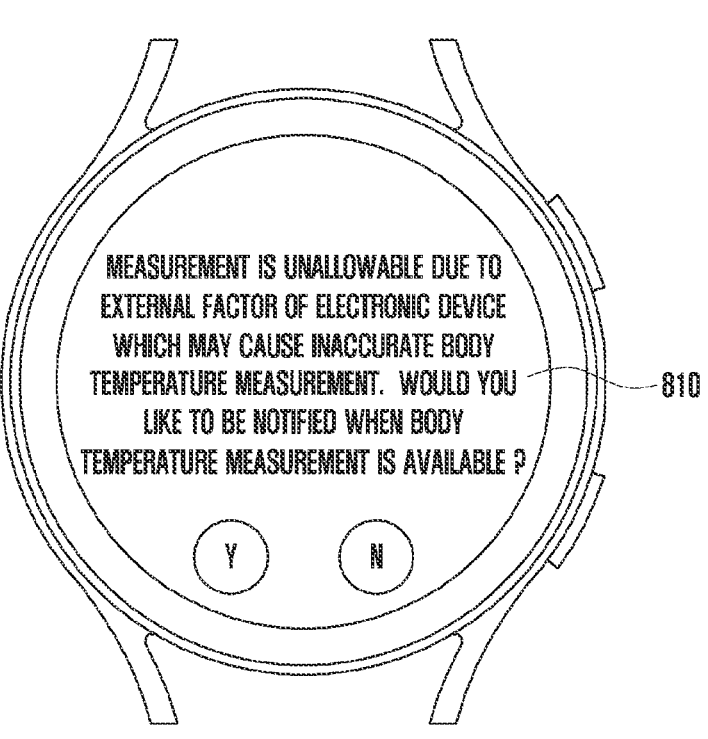
FIG. 8 illustrates a guide providing operation of an electronic device according to various example embodiments.

FIG. 8 illustrates an operation of providing information indicating whether the electronic device can measure the skin temperature, according to various embodiments.

According to an embodiment, the processor (e.g., 450 in FIG. 4) may provide the user with information indicating that the body temperature measurement may be inaccurate due to external factors of the electronic device (e.g., the electronic device 400 in FIG. 4). Alternatively, at the time point when the temperature measurement is available, the electronic device 400 may provide the user with related information (e.g., information indicating that the electronic device 400 is in a stable state in which accurate measurement of the skin temperature is available) or output, on a display 810, information for requesting user's determination on whether to receive related information. The display 810 may include both the configuration and functions of the display module 160 (comprising a display) in FIG. 1.

According to an embodiment, the processor 450 may output (not shown), by using the display 810, information indicating that the body temperature measurement preparation is completed, in response to identifying that the difference between the temperature of the HRM thermistor (e.g., 463 in FIG. 4) and the skin temperature measured using a temperature sensor (e.g., 411 in FIG. 4) is less than a predetermined level.

Alternatively, the processor 450 may not be ready for the body temperature measurement preparation in response to identifying that a difference between the temperature of the HRM thermistor 463 and the skin temperature measured using the temperature sensor 411 is beyond a predetermined level, and may calculate a waiting time required for body temperature measurement preparation and output (not shown) the calculated waiting time on the display 810.

According to an embodiment, the processor 450 may perform control to execute at least one application (e.g., a health application) configured to monitor the user's biometric information, in response to identifying that the temperature of the second area where the user is located is relatively higher than that of the first area. According to an embodiment, the processor 450 may collect the user's biometric information by using at least one application configured to monitor user's biometric information and provide the biometric information to the user. The user's biometric information that may be provided by the processor 450 may include, for example, at least one of heart rate, stress, oxygen saturation, and blood pressure. The processor 450 may provide the user with additional information about biological change caused by the change in the external environment temperature.

FIG. 9 is a flowchart showing a method for controlling a temperature of an electronic device according to various embodiments.

The method for controlling a temperature of the electronic device (e.g., the electronic device 400 in FIG. 4) according to various embodiments may include measuring the internal temperature of the electronic device 400 in response to identifying, by using a temperature sensor (e.g., the temperature sensor in FIG. 4), that the ambient temperature of the electronic device 400 is changed beyond a preconfigured level within a predetermined time (e.g., see operation 902).

The method for controlling a temperature of the electronic device 400 according to various embodiments may include, in response to identifying, through comparison, that the measured internal temperature of the electronic device 400 is lower than the ambient temperature of the electronic device 400 by more than a predetermined level, controlling at least one component inside the electronic device 400 to perform control to raise the internal temperature of the electronic device 400 to a preconfigured first level (e.g., see operation 904).

According to an embodiment, the processor (e.g., the processor 450 in FIG. 4) may be configured to increase a driving frequency of the processor 450 to raise the internal temperature of the electronic device 400 to the first level.

According to an embodiment, the processor 450 may be configured to increase the intensity of a current applied to a display of the electronic device 400 (e.g., the display module 160 in FIG. 1) to raise the internal temperature of the electronic device 400 to the first level.

According to an embodiment, the processor 450 may be configured to increase a scan rate of the display 160 of the electronic device 400 to raise the internal temperature of the electronic device 400 to the first level.

According to an embodiment, the processor 450 may be configured to determine that the electronic device 400 is currently located indoors, based on a state thereof corresponding to at least one among states in which the number of GPS satellites detected using the communication module 420 (comprising communication circuitry) is less than a predetermined level, or the strength of GPS signal detected using the communication module 420 is less than a predetermined level, or the number of user's steps are not measured.

According to an embodiment, the processor 450 may be configured to, based on the determination that the electronic device 400 is currently located indoors, execute at least one application having been executed indoors by a predetermined number of times or more, and perform control such that the version of the at least one executed application is identified and updated to the latest version.

According to an embodiment, the processor 450 may be configured to, in response to determining to raise the internal temperature of the electronic device 400 to the preconfigured first level by controlling at least one component inside the electronic device 400, execute at least one application preconfigured to raise the temperature of the processor 450, and in response to identifying that the temperature of the electronic device 400 has risen to the first level, perform control to stop the driving of the at least one application.

According to an embodiment, the processor 450 may be configured to, in response to determining to raise the internal temperature of the electronic device 400 to the preconfigured first level by controlling at least one component inside the electronic device 400, execute at least one application configured to monitor user's biometric information to measure user's biometric information, and output the measured biometric information on the display 160.

According to an embodiment, the processor 450 may be configured to output, on the display 160, information indicating that user's skin temperature measurement preparation is completed, in response to identifying that the temperature of the electronic device 400 has risen to the first level.

According to an embodiment, the processor 450 may be configured to, in response to identifying that the temperature of the electronic device 400 has not risen to the first level, calculate a waiting time required for the temperature of the electronic device 400 to reach the first level and output the waiting time on the display, and output, on the display 160, information indicating that body temperature measurement is unallowable until the temperature of the electronic device 400 reaches the first level.

The method for controlling a temperature of the electronic device 400 according to various embodiments may include, in response to identifying, through comparison, that the measured internal temperature of the electronic device 400 is higher than the ambient temperature of the electronic device 400 by more than a predetermined level, controlling at least one component inside the electronic device 400 to perform control to lower the internal temperature of the electronic device 400 to a preconfigured second level (e.g., see operation 906 in FIG. 9).

According to an embodiment, the processor 450 may be configured to decrease a driving frequency of the processor 450 to lower the internal temperature of the electronic device 400 to the second level.

According to an embodiment, the processor 450 may be configured to decrease the intensity of a current applied to the display 160 of the electronic device 400 to lower the internal temperature of the electronic device 400 to the second level.

According to an embodiment, the processor 450 may be configured to decrease a scan rate of the display 160 of the electronic device 400 to lower the internal temperature of the electronic device 400 to the second level.

According to an embodiment, the processor 450 may be configured to determine that the electronic device 400 is currently located indoors, based on a state thereof corresponding to at least one among states in which the number of GPS satellites detected using the communication module 420 is less than a predetermined level, or the strength of GPS signal detected using the communication module 420 is less than a predetermined level, or the number of user's steps are not measured, and in response to the determination that the electronic device 400 is currently located indoors, stop the driving of at least one application having been executed indoors by less than a predetermined number of times.

According to an embodiment, the processor 450 may be configured to output, on the display 160, information indicating that user's skin temperature measurement preparation is completed, in response to identifying that the temperature of the electronic device 400 has dropped to the second level.

According to an embodiment, the processor 450 may be configured to, in response to identifying that the temperature of the electronic device 400 has not dropped to the second level, calculate a waiting time required for the temperature of the electronic device 400 to reach the second level and output the waiting time on the display, and output, on the display 160, information indicating that body temperature measurement is unallowable until the temperature of the electronic device 400 reaches the second level.

An electronic device according to various embodiments may include a temperature sensor, a display, and a processor operatively connected, directly or indirectly, to the temperature sensor, wherein the processor may be configured to: in response to identifying, by using the temperature sensor, that the ambient temperature of the electronic device is changed beyond a preconfigured level within a predetermined time, measure the internal temperature of the electronic device; and in response to identifying, through comparison, that the measured internal temperature of the electronic device is lower than the ambient temperature of the electronic device by more than a predetermined level, control at least one component inside the electronic device to perform control to raise the internal temperature of the electronic device to a preconfigured first level.

According to an embodiment, the processor may be configured to increase a driving frequency of the processor to raise the internal temperature of the electronic device to the first level.

According to an embodiment, the processor may be configured to increase the intensity of a current applied to the display of the electronic device to raise the internal temperature of the electronic device to the first level.

According to an embodiment, the processor may be configured to increase a scan rate of the display of the electronic device to raise the internal temperature of the electronic device to the first level.

According to an embodiment, the processor may be configured to determine that the electronic device is currently located indoors, based on a state thereof corresponding to at least one among states in which the number of GPS satellites detected using a communication module is less than a predetermined level, or the strength of GPS signal detected using the communication module is less than a predetermined level, or the number of user's steps are not measured. "Based on" as used herein covered based at least on.

According to an embodiment, the processor may be configured to, based on the determination that the electronic device is currently located indoors, execute at least one application having been executed indoors by a predetermined number of times or more, and perform control such that the version of the at least one executed application is identified and updated to the latest version.

According to an embodiment, the processor may be configured to, in response to determining to raise the internal temperature of the electronic device to a preconfigured first level by controlling at least one component inside the electronic device, execute at least one application preconfigured to raise the temperature of the processor, and in response to identifying that the temperature of the electronic device has risen to the first level, perform control to stop the driving of the at least one application.

According to an embodiment, the processor may be configured to, in response to determining to raise the internal temperature of the electronic device to the preconfigured first level by controlling at least one component inside the electronic device, execute at least one application configured to monitor user's biometric information to measure user's biometric information, and output the measured biometric information on the display.

According to an embodiment, the processor may be configured to output, on the display, information indicating that user's skin temperature measurement preparation is completed, in response to identifying that the temperature of the electronic device has risen to the first level.

According to an embodiment, the processor may be configured to, in response to identifying that the temperature of the electronic device has not risen to the first level, calculate a waiting time required for the temperature of the electronic device to reach the first level and output the waiting time on the display, and output, on the display, information indicating that body temperature measurement is unallowable until the temperature of the electronic device reaches the first level.

An electronic device according to various embodiments may include a temperature sensor, a display, and a processor operatively connected, directly or indirectly, to the temperature sensor, wherein the processor may be configured to: in response to identifying, by using the temperature sensor, that the ambient temperature of the electronic device is changed beyond a preconfigured level within a predetermined time, measure the internal temperature of the electronic device; and in response to identifying, through comparison, that the measured internal temperature of the electronic device is higher than the ambient temperature of the electronic device by more than a predetermined level, control at least one component inside the electronic device to perform control to lower the internal temperature of the electronic device to a preconfigured second level.

A method for controlling a temperature of an electronic device according to various embodiments may include: measuring the internal temperature of the electronic device in response to identifying, by using a temperature sensor, that the ambient temperature of the electronic device is changed beyond a preconfigured level within a predetermined time; in response to identifying, through comparison, that the measured internal temperature of the electronic device is lower than the ambient temperature of the electronic device by more than a predetermined level, controlling at least one component inside the electronic device to perform control to raise the internal temperature of the electronic device to a preconfigured first level; and in response to identifying, through comparison, that the measured internal temperature of the electronic device is higher than the ambient temperature of the electronic device by more than a predetermined level, controlling at least one component inside the electronic device to perform control to lower the internal temperature of the electronic device to a preconfigured second level.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various example embodiments and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via at least a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various example embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities, and some of the multiple entities mat be separately disposed in any other element. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising:
a first temperature sensor configured to measure an internal temperature of the electronic device;

a second temperature sensor configured to measure an ambient temperature of the electronic device;
a third temperature sensor configured to obtain biometric information of a person wearing the electronic device;
a display; and
at least one processor comprising processor circuitry operatively connected to the first temperature sensor, the second temperature sensor, the third temperature sensor and the display;
wherein the at least one processor is configured individually and/or collectively, to:
compare the internal temperature of the electronic device and the ambient temperature of the electronic device,
when the measured internal temperature of the electronic device is lower than the ambient temperature of the electronic device by at least a predetermined level, control at least one electronic component inside the electronic device to raise the internal temperature of the electronic device to a preconfigured target level, and
obtain biometric information using the third temperature sensor when the internal temperature of the electronic device is equal to or greater than the preconfigured target level.

2. The electronic device of claim 1, wherein the at least one processor is configured individually and/or collectively to increase a driving frequency of the at least one processor to raise the internal temperature of the electronic device to at least the preconfigured target level.

3. The electronic device of claim 1, wherein the at least one processor is configured individually and/or collectively to increase an intensity of a current applied to the display of the electronic device to raise the internal temperature of the electronic device to the preconfigured target level.

4. The electronic device of claim 1, wherein the at least one processor is configured individually and/or collectively to increase a scan rate of the display of the electronic device to raise the internal temperature of the electronic device to at least the preconfigured target level.

5. The electronic device of claim 1, wherein the at least one processor is configured individually and/or collectively to determine that the electronic device is currently located indoors, based on a state of the electronic device corresponding to at least one among states in which a number of GPS satellites detected using a communication module, comprising communication circuitry, is less than a predetermined level, the strength of a GPS signal detected is less than a predetermined level, and/or a number of user's steps are not measured.

6. The electronic device of claim 5, wherein the at least one processor is configured individually and/or collectively to:
based on the determination that the electronic device is currently located indoors, execute at least one application having been executed indoors a predetermined number of times or more and perform control such that a version of the at least one executed application is identified and updated to a latest version.

7. The electronic device of claim 1, wherein the at least one processor is configured individually and/or collectively to:
in response to a determination to raise the internal temperature of the electronic device to the preconfigured target level, execute at least one application preconfigured to raise the temperature of the processor; and in response to a determination that the temperature of the electronic device has risen to the preconfigured target level, control to stop driving of the at least one application.

8. The electronic device of claim 1, wherein the biometric information comprises a skin temperature of the user.

9. The electronic device of claim 1, wherein the at least one processor is configured individually and/or collectively to:

in response to a determination that the temperature of the electronic device has not risen to the first level, calculate a waiting time for the temperature of the electronic device to reach the preconfigured target level and control to output the waiting time via the display; and control to output, via the display, information indicating that body temperature measurement is unallowable until the temperature of the electronic device equal to or greater than the preconfigured target level.

10. An electronic device comprising:

a first temperature sensor configured to measure an internal temperature of the electronic device;

a second temperature sensor configured to measure an ambient temperature of the electronic device;

a third temperature sensor configured to obtain biometric information of a person wearing the electronic device;

a display; and at least one processor comprising processor circuitry operatively connected to the first temperature sensor the second temperature sensor, the third temperature sensor and the display;

wherein the at least one processor is configured individually and/or collectively to:

compare the internal temperature of the electronic device and the ambient temperature of the electronic device;

when the measured internal temperature of the electronic device is higher than the ambient temperature of the electronic device by at least a predetermined level, control at least one electronic component inside the electronic device to lower the internal temperature of the electronic device to a preconfigured target level for measuring a user's biometric information; and obtain biometric information using the third temperature sensor when the internal temperature of the electronic device is equal to or lower than the preconfigured target level.

11. The electronic device of claim 10, wherein the at least one processor is configured individually and/or collectively to decrease a driving frequency of the processor to lower the internal temperature of the electronic device to at least the preconfigured target level.

12. The electronic device of claim 10, wherein the at least one processor is configured individually and/or collectively to decrease the intensity of a current applied to the display of the electronic device to lower the internal temperature of the electronic device to at least the preconfigured target level.

13. The electronic device of claim 10, wherein the at least one processor is configured individually and/or collectively to decrease a scan rate of the display of the electronic device to lower the internal temperature of the electronic device to at least the preconfigured target level.

14. The electronic device of claim 10, wherein the at least one processor is configured individually and/or collectively to:

determine that the electronic device is currently located indoors, based on a state of the electronic device corresponding to at least one among states in which a number of GPS satellites detected is less than a predetermined level, the strength of a GPS signal detected is less than a predetermined level, and/or a number of user's steps are not measured; and stop the driving of at least one application having been executed indoors by less than a predetermined number of times, based on the determination that the electronic device is currently located indoors.

15. The electronic device of claim 10, wherein the at least one processor is configured individually and/or collectively to output, via the display, information indicating that user's skin temperature measurement preparation is completed, based on a determination that the temperature of the electronic device has dropped to the second level.

16. The electronic device of claim 10, wherein the at least one processor is configured individually and/or collectively to:

in response to a determination that the temperature of the electronic device has not risen to the first level, calculate a waiting time for the temperature of the electronic device to reach the preconfigured target level and control to output the waiting time via the display; and control to output, via the display, information indicating that body temperature measurement is unallowable until the temperature of the electronic device equal to or greater than the preconfigured target level.

17. A method for controlling a temperature of an electronic device, the method comprising:

comparing an internal temperature of the electronic device and an ambient temperature of the electronic device, when the measured internal temperature of the electronic device is lower than the ambient temperature of the electronic device by at least a predetermined level, controlling at least one electronic component inside the electronic device to raise the internal temperature of the electronic device to a preconfigured target level, and obtaining biometric information using a temperature sensor when the internal temperature of the electronic device is equal to or greater than the preconfigured target level.

18. The method of claim 17, further comprising using at least one processor comprising processor circuitry to execute at least one application inside the electronic device to perform control to raise the internal temperature of the electronic device to at least the preconfigured target level, said executing the at least one application comprises at least one of:

executing at least one application having been executed indoors by a predetermined number of times or more;

performing control to execute at least one application configured to monitor user's biometric information; or performing control to execute at least one application preconfigured to raise the temperature of the processor.

19. The method of claim 17, further comprising:

outputting, on a display of the electronic device, information indicating that body temperature measurement is unallowable until the temperature of the electronic device equal to or greater than the preconfigured target level;

outputting, on the display, information indicating that user's skin temperature measurement preparation is completed, in response to at least identifying that the temperature of the electronic device has risen to the preconfigured target level; and in response to at least identifying that the temperature of the electronic device has not risen to the preconfigured target level, calculating a waiting time for the temperature of the electronic device equal to or greater than the preconfigured target level and outputting the waiting time on the display.

* * * * *